United States Patent
Jiang et al.

(10) Patent No.: US 11,190,173 B2
(45) Date of Patent: **\*Nov. 30, 2021**

(54) AREA EFFICIENT SLEW-RATE CONTROLLED DRIVER

(71) Applicant: QUALCOMM Incorporated, San Diego, CA (US)

(72) Inventors: Jize Jiang, Singapore (SG); Kan Li, Singapore (SG)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/247,160

(22) Filed: Dec. 2, 2020

(65) Prior Publication Data

US 2021/0336611 A1    Oct. 28, 2021

Related U.S. Application Data

(63) Continuation of application No. 16/858,343, filed on Apr. 24, 2020, now Pat. No. 10,938,381.

(51) Int. Cl.
*H03K 5/12* (2006.01)
*H03K 5/04* (2006.01)

(52) U.S. Cl.
CPC .............. *H03K 5/12* (2013.01); *H03K 5/04* (2013.01)

(58) Field of Classification Search
CPC .................................. H03K 5/04; H03K 5/12
USPC ......................................... 327/108, 109, 170
See application file for complete search history.

(56) References Cited

U.S. PATENT DOCUMENTS

| | | |
|---|---|---|
| 6,222,403 B1 | 4/2001 | Mitsuda |
| 6,888,388 B1 | 5/2005 | Cook et al. |
| 8,970,281 B2 | 3/2015 | Kawamoto et al. |
| 9,654,181 B1 | 5/2017 | Wobak et al. |
| 10,516,333 B2 | 12/2019 | Ramalingam et al. |
| 10,756,725 B2 | 8/2020 | Jordanger |
| 10,938,381 B1 | 3/2021 | Jiang et al. |
| 2006/0279339 A1* | 12/2006 | Rebholz-Goldmann .................... H03K 17/164 327/108 |
| 2012/0126859 A1* | 5/2012 | Kawamoto .......... H03K 17/163 327/108 |
| 2012/0249020 A1 | 10/2012 | Komatsu et al. |

(Continued)

FOREIGN PATENT DOCUMENTS

EP          3503398 A1    6/2019

OTHER PUBLICATIONS

International Search Report and Written Opinion—PCT/US2021/020926—ISA/EPO—Jun. 1, 2021.

*Primary Examiner* — William Hernandez
(74) *Attorney, Agent, or Firm* — Loza & Loza, LLP

(57) ABSTRACT

According to certain aspects, a driver includes an output transistor coupled between a first rail and an output of the driver, a first current source coupled to a gate of the output transistor, a second current source, and a switch, wherein the switch and the second current source are coupled in series between the gate of the output transistor and a second rail. The driver also includes a current sensor configured to generate a sense current based on an output current of the driver, and a reference current source configured to generate a reference current, wherein the current sensor and the reference current source are coupled to a control input of the switch.

17 Claims, 16 Drawing Sheets

(56) References Cited

U.S. PATENT DOCUMENTS

2013/0314020 A1* 11/2013 Sugie .................. H02P 6/085
                                                    318/503
2019/0265744 A1    8/2019 Tajima

* cited by examiner

AREA EFFICIENT SLEW-RATE CONTROLLED DRIVER

CLAIM OF PRIORITY

The present Application for Patent is a continuation of, and claims priority to application Ser. No. 16/858,343 entitled "AREA EFFICIENT SLEW-RATE CONTROLLED DRIVER" filed Apr. 24, 2020, and assigned to the assignee hereof, which is hereby expressly incorporated by reference herein.

BACKGROUND

Field

Aspects of the present disclosure relate generally to drivers, and more particularly, to slew-rate controlled drivers.

Background

A driver may be used to drive a signal (e.g., a data signal) from a first device to a second device via a transmission line (e.g., one or more metal traces, a cable, etc.). It is desirable for the slew rate of the driver to be well controlled in order to minimize signal degradation due to reflection, electromagnetic interference (EMI), etc. The slew rate is characterized by a change of voltage per unit time.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later. The invention is defined by the claims. Implementations and aspects that do not fall within the scope of the claims are merely examples used for explanation of the invention.

A first aspect relates to a driver. The driver includes an output transistor coupled between a first rail and an output of the driver, a first current source coupled to a gate of the output transistor, a second current source, and a switch, wherein the switch and the second current source are coupled in series between the gate of the output transistor and a second rail. The driver also includes a current sensor configured to generate a sense current based on an output current of the driver, and a reference current source configured to generate a reference current, wherein the current sensor and the reference current source are coupled to a control input of the switch.

A second aspect relates to a driver. The driver includes an output transistor coupled between a rail and an output of the driver, a first current source coupled to a gate of the output transistor, and a second current source configured to sink current from or source current to the gate of the output transistor when the second current source is enabled. The driver also includes a current sensor configured to sense an output current of the driver, and a control circuit coupled to the current sensor and the second current source, wherein the control circuit is configured to enable the second current source if the sensed output current is above a threshold, and disable the second current source if the sensed output current is below the threshold.

A third aspect relates to a slew-rate control method for a driver. The driver includes an output transistor coupled between a rail and an output of the driver. The method includes pre-driving a gate of the output transistor with a pre-drive current using a first current source, and sensing an output current of the driver. The method also includes enabling a second current source if the sensed output current is above a threshold, the second current source providing additional pre-drive current for the gate of the output transistor, and disabling the second current source if the sensed output current is below the threshold.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
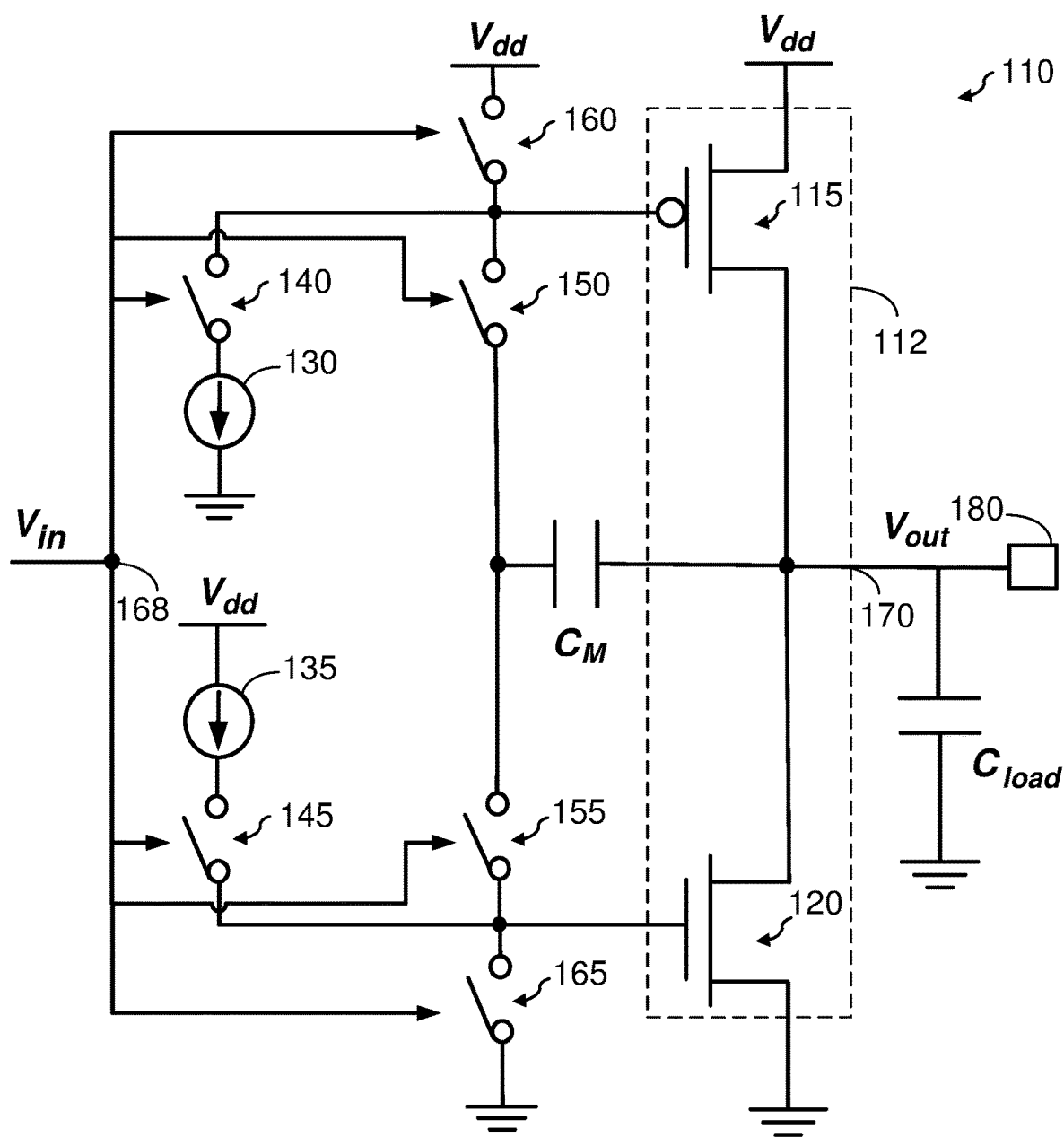
FIG. 1A shows an example of a driver with capacitive feedback to control the slew rate of the driver according to certain aspects of the present disclosure.

FIG. 1A shows an example of a driver 110 that achieves slew-rate control using capacitive feedback. The driver 110 may be used to drive a signal (e.g., a data signal) from a first device to a second device via a transmission line (e.g., one or more metal traces, a cable, etc.). The first device and the second device may be located on separate chips (e.g., for chip-to-chip communication). In FIG. 1A, the capacitive load coupled to the output 170 of the driver 110 is represented by load capacitor $C_{load}$. The load capacitance may include the capacitance of the transmission line (not shown) coupled to the output 170 of the driver 110, the capacitance of a pad 180 coupling the output 170 to the transmission line, etc.

The driver 110 includes an output stage 112, a feedback capacitor CM, a first current source 130, a second current source 135, a first switch 140, a second switch 145, a third switch 150, a fourth switch 155, a fifth switch 160, and a sixth switch 165. The output stage 112 includes a first output transistor 115 and a second output transistor 120. As discussed further below, the feedback capacitor CM (also referred to as a Miller capacitor) is used to form a capacitive feedback loop that controls the slew rate of the driver 110 approximately independent of variations in the load capacitance $C_{load}$.

The first output transistor 115 is implemented with a p-type field effect transistor (PFET) coupled between a voltage supply rail $V_{dd}$ and the output 170 of the driver 110, and the second output transistor 120 is implemented with an n-type field effect transistor (NFET) coupled between the output 170 of the driver 110 and a ground rail. The first output transistor 115 is used to drive the output 170 high (i.e., pull up the output 170), and the second output transistor 120 is used to drive the output 170 low (i.e., pull down the output 170), as discussed further below. In the drawings, the ground rail is represented by the ground symbol.

The first current source 130 is configured to sink current to the ground rail. As discussed further below, the first current source 130 is used to pre-drive the gate of the first output transistor 115 low in order to drive the output 170 of the driver 110 high. The second current source 135 is configured to source current from the voltage supply rail $V_{dd}$. As discussed further below, the second current source 135 is used to pre-drive the gate of the second output transistor 120 high in order to drive the output 170 of the driver 110 low.

The first switch 140 is coupled between the first current source 130 and the gate of the first output transistor 115, and the second switch 145 is coupled between the second current source 135 and the gate of the second output transistor 120. The third switch 150 is coupled between the feedback capacitor CM and the gate of the first output transistor 115, and the fourth switch 155 is coupled between the feedback capacitor CM and the gate of the second output transistor 120. The fifth switch 160 is coupled between the voltage supply rail $V_{dd}$ and the gate of the first output transistor 115, and the sixth switch 165 is coupled between the gate of the second output transistor 120 and the ground rail. The on/off states of the first switch 140, the second switch 145, the third switch 150, the fourth switch 155, the fifth switch 160, and the sixth switch 165 are controlled by an input voltage (labeled "$V_{in}$") input to the input 168 of the driver 110, as discussed further below.

The driver 110 is configured to drive the output 170 high or low based on the input voltage at the input 168 of the driver 110. More particularly, the driver 110 drives the output 170 high when the input voltage has a first logic value and drives the output 170 low when the input voltage has a second logic value. The first logic value may be low (e.g., approximately ground) and the second logic value may be high (e.g., approximately Va.), or vice versa.

Figure 1B:
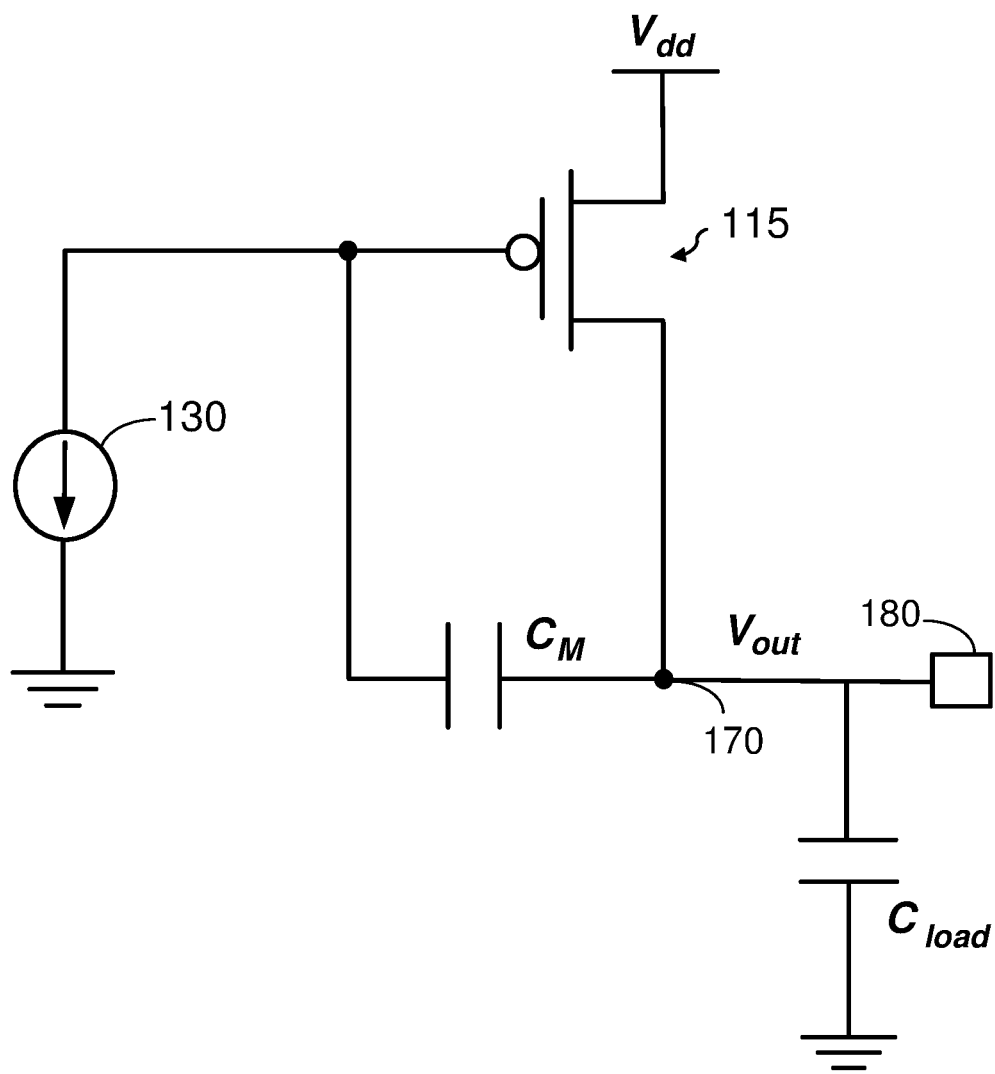
FIG. 1B shows an equivalent circuit of the driver in FIG. 1A for the case where the driver output is driven high according to certain aspects of the present disclosure.

When the input voltage has the first logic value, the fifth switch 160 is opened (i.e., turned off) and the sixth switch 165 is closed (i.e., turned on). As a result, the gate of the second output transistor 120 is coupled to the ground rail by the sixth switch 165, which disables (i.e., turns off) the second output transistor 120. In addition, the first switch 140 is closed (i.e., turned on) and the second switch 145 is opened (i.e., turned off). As a result, the first current source 130 is coupled to the gate of the first output transistor 115, allowing the first current source 130 to sink current from the gate of the first output transistor 115 to ground, as discussed further below. Further, the third switch 150 is closed (i.e., turned on) and the fourth switch 155 is opened (i.e., turned off). As a result, the feedback capacitor CM is coupled between the output 170 of the driver 110 and the gate of the first output transistor 115. FIG. 1B shows an equivalent circuit of the driver 110 for the case where the input voltage has the first logic value.

In this case, the first current source 130 sinks current from the gate of the first output transistor 115 to ground, which pre-drives the gate of the first output transistor 115 low (i.e., decreases the gate voltage of the first output transistor 115). Since the first output transistor 115 is implemented with a PFET, this causes the first output transistor 115 to turn on, allowing current to flow from the voltage supply rail $V_{dd}$ to the output 170 of the driver 110 through the first output transistor 115. The output current of the driver 110 charges the load capacitance $C_{load}$, causing the output voltage (labeled "$V_{out}$") to ramp up (i.e., transition from low to high).

During the transition of the output 170 from low to high, the feedback capacitor CM forms a capacitive feedback loop that controls the slew rate of the driver 110. To the first order, the feedback loop sets the slew rate of the driver 110 to approximately the following:

$$\text{Slew Rate} = \frac{I_S}{C_M} \quad (1)$$

where $I_S$ is the current of the first current source 130 and $C_M$ in equation (1) is the capacitance of the feedback capacitor $C_M$. Thus, the slew rate is set by the current of the first current source 130 and the capacitance of the feedback capacitor $C_M$, both of which are independent of the capacitive load $C_{load}$ at the output 170. Therefore, the capacitive feedback provided by the feedback capacitor $C_M$ allows the slew rate of the driver 110 to be set to a desired slew rate approximately independent of the capacitive load $C_{load}$.

Figure 1C:
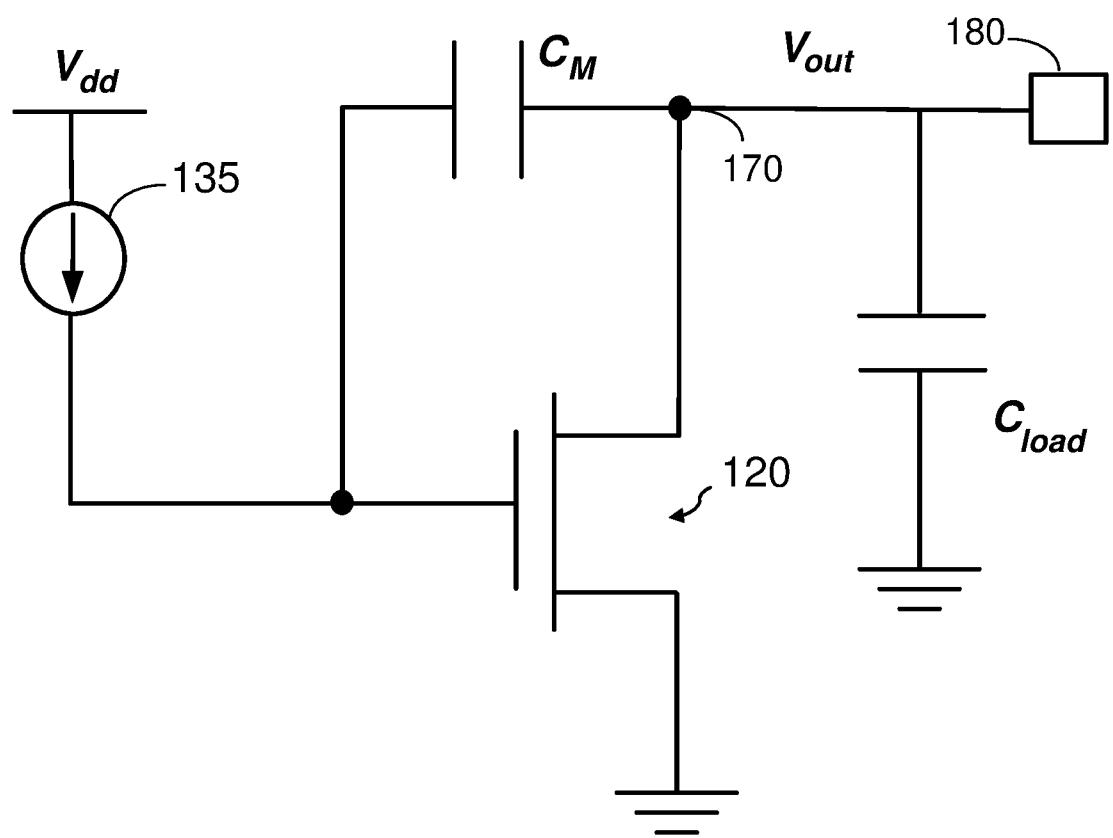
FIG. 1C shows an equivalent circuit of the driver in FIG. 1A for the case where the driver output is driven low according to certain aspects of the present disclosure.

When the input voltage has the second logic value, the fifth switch 160 is closed (i.e., turned on) and the sixth switch 165 is opened (i.e., turned off). As a result, the gate of the first output transistor 115 is coupled to the voltage supply rail $V_{dd}$ by the fifth switch 160, which disables (i.e., turns off) the first output transistor 115. In addition, the first switch 140 is opened (i.e., turned off) and the second switch 145 is closed (i.e., turned on). As a result, the second current source 135 is coupled to the gate of the second output transistor 120, allowing the second current source 135 to source current to the gate of the second output transistor 120, as discussed further below. Further, the third switch 150 is opened (i.e., turned off) and the fourth switch 155 is closed (i.e., turned on). As a result, the feedback capacitor $C_M$ is coupled between the output 170 of the driver 110 and the gate of the second output transistor 120. FIG. 1C shows an equivalent circuit of the driver 110 for the case where the input voltage has the second logic value.

In this case, the second current source 135 sources current to the gate of the second output transistor 120, which pre-drives the gate of the second output transistor 120 high (i.e., increases the gate voltage of the second output transistor 120). Since the second output transistor 120 is implemented with an NFET, this causes the second output transistor 120 to turn on, allowing current to flow from the output 170 of the driver 110 to the ground rail through the second output transistor 120. This discharges the load capacitance $C_{load}$, causing the output voltage (labeled "$V_{out}$") to ramp down (i.e., transition from high to low). During the transition of the output 170 from high to low, the feedback capacitor $C_M$ forms a feedback loop that sets the slew rate of the driver 110 approximately independent of the load capacitance (e.g., according to equation (1) discussed above).

Thus, the feedback capacitor $C_M$ forms a capacitive feedback loop that allows the slew rate of the driver 110 to be set independent of variations in the load capacitance $C_{load}$ (e.g., due to variations in the length of the transmission line coupled to the output 170). The slew rate of the driver 110 may be set, for example, by setting the pre-drive current $I_s$ and/or the capacitance of the feedback capacitor $C_M$ according to the desired slew rate (e.g., based on equation (1)). In this example, the pre-drive current $I_s$ is the current of the first current source 130 when the output 170 transitions from low to high, and the pre-drive current $I_s$ is the current of the second current source 135 when the output 170 transitions from high to low. As used herein, "pre-drive current" refers to a current that drives the gate of an output transistor (e.g., the first output transistor 115 or the second output transistor 120).

A challenge with using capacitive feedback to control the slew rate of a driver is that capacitive feedback may require that the feedback capacitor $C_M$ have a large capacitance in order to provide enough loop gain for good slew-rate control. The large feedback capacitance may require that the feedback capacitor $C_M$ have a large size, which can take up a large area of a chip. This may especially be the case for a chip with a low capacitance density, which increases the size of a capacitor on the chip for a given capacitance. Accordingly, a more area efficient approach for controlling the slew rate of a driver is desirable.

In addition, using a large feedback capacitor $C_M$ to provide enough loop gain for good slew-rate control may increase power consumption of the driver 110. This can be seen by looking at equation (1). In equation (1), the slew rate of the driver 110 is approximately equal to the pre-drive current $I_s$ divided by the capacitance of the feedback capacitor $C_M$. Thus, making the capacitance of the feedback capacitor $C_M$ larger to increase the loop gain requires making the pre-drive current $I_s$ larger in order to achieve a desired slew rate for the driver 110. The larger pre-drive current $I_s$ may increase the power consumption of the driver 110. Accordingly, a more power efficient approach for controlling the slew rate of a driver is desirable.

Aspects of the present disclosure provide slew-rate control for a driver without the need for a large feedback capacitor $C_M$, reducing the chip area and/or power consumption of the driver, as discussed further below. In certain aspects, slew-rate control is achieved by sensing the output current of the driver to indirectly detect the load capacitance at the driver output, and enabling additional pre-drive current when a large load capacitance is detected. This reduces variation in the slew rate (i.e., transition time) of the driver across a range of load capacitances, as discussed further below.

Figure 2:
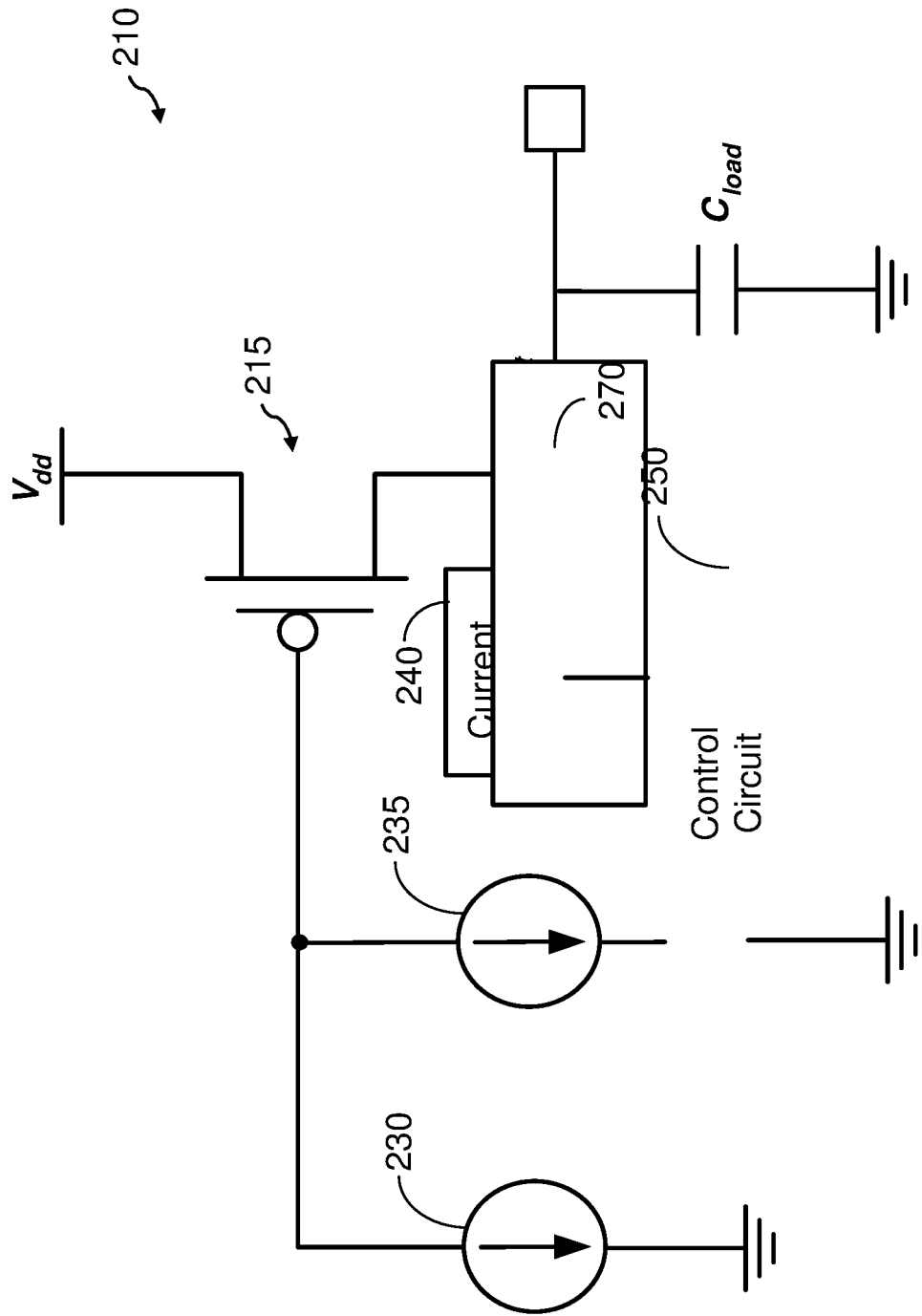
FIG. 2 shows an example of a slew-rate controlled driver according to certain aspects of the present disclosure.

FIG. 2 shows an exemplary slew-rate controlled driver 210 according to aspects of the present disclosure. The driver 210 is configured to drive the output 270 high (i.e., pull up the output 270). An exemplary slew-rate controlled driver configured to drive an output low is discussed below with reference to FIG. 7.

The driver 210 includes an output transistor 215 and a first current source 230. The output transistor 215 is implemented with a PFET coupled between the voltage supply rail $V_{dd}$ and the output 270 of the driver 210. More particularly, the source of the output transistor 215 is coupled to the voltage supply rail $V_{dd}$ and the drain of the output transistor 215 is coupled to the output 270. The voltage supply rail $V_{dd}$ provides a supply voltage of $V_{dd}$ from a voltage source (not shown) and may include one or more metal rails coupled to the voltage source. The voltage source may include switching voltage regulator, a linear voltage regulator, a power management integrated circuit (PMIC), a battery, etc. The first current source 230 is coupled to the gate of the output transistor 215 and is configured to sink current from the gate of the output transistor 215 to pre-drive the gate of the output transistor 215 low.

The driver 210 also includes a second current source 235, a current sensor 240, and a control circuit 250. The second current source 235 is selectively enabled or disabled by the control circuit 250, as discussed further below. When enabled by the control circuit 250, the second current source 235 is configured to sink current from the gate of the output transistor 215 to ground. In certain aspects, the control circuit 250 enables the second current source 235 to provide additional pre-drive current when a large capacitance load is detected at the output 270, as discussed further below.

The current sensor 240 is configured to sense the output current of the driver 210. In this example, the output current refers to the current flowing through the output transistor 215 to the output 270 of the driver 210. The sensed output current provided by the current sensor 240 allows the control circuit 250 to detect a large load capacitance $C_{load}$ at the output 270. This is because a larger load capacitance $C_{load}$ increases the output current of the driver 210 since more current is needed to charge the larger load capacitance $C_{load}$. Thus, the sensed output current provides information on the load capacitance $C_{load}$, allowing the control circuit 250 to indirectly detect a large load capacitance $C_{load}$ based on the sensed output current.

The control circuit 250 is coupled to the current sensor 240 and the second current source 235. In one example, the control circuit 250 is configured to enable the second current source 235 if the sensed output current from the current sensor 240 is above a threshold. In this case, a sensed output current above the threshold may indicate a large load capacitance $C_{load}$ coupled to the output 270. Thus, in this example, the second current source 235 is enabled when a large load capacitance $C_{load}$ is detected based on the sensed output current. The control circuit 250 is configured to disable the second current source 235 if the sensed output current from the current sensor 240 is below the threshold.

Exemplary operations of the driver 210 will now be discussed according to certain aspects for the case where the driver 210 transitions the output 270 from low to high. In this case, it is assumed that the gate of the output transistor 215 is initially high (e.g., approximately $V_{dd}$) and the output 270 is initially low (e.g., approximately ground). The gate of the output transistor 215 may be initially set high, for example, by closing a switch (not shown) between the gate of the output transistor 215 and the voltage supply rail $V_{dd}$, and then opening the switch before the transition from low to high. The output 270 may be initially set low, for example, by another driver (not shown) configured to drive the output 270 low.

To transition of the output 270 from low to high, the first current source 230 sinks current from the gate of the output transistor 215 to ground, which pre-drives the gate of the output transistor 215 low. Since the output transistor 215 is implemented with a PFET, this causes the output transistor 215 to turn on, allowing current to flow from the voltage supply rail $V_{dd}$ to the output 270 of the driver 210 through the output transistor 215. The output current of the driver 210 charges the load capacitance $C_{load}$, causing the output voltage (labeled "$V_{out}$") to ramp up.

During the transition from low to high, the current sensor 240 senses the output current of the driver 210 and communicates the sensed output current to the control circuit 250. As discussed above, the sensed output current provides information on the load capacitance $C_{load}$ coupled to the output 270.

When the sensed output current is below the threshold, the control circuit 250 disables the second current source 235, in which case the second current source 235 does not provide additional pre-drive current. For example, if a small load capacitance $C_{load}$ is coupled to the output 270 of the driver 210, the sensed output current may stay below the threshold for the entire transition from low to high. In this case, no additional pre-drive current is provided by the second current source 235.

When the sensed output current rises above the threshold, the control circuit 250 enables the second current source 235 to provide additional pre-drive current. This may occur, for example, when a large load capacitance $C_{load}$ is coupled to the output 270. The additional pre-drive current pulls the gate voltage of the output transistor 215 lower, which increases the output current to charge the large load capacitance $C_{load}$ and causes the output voltage $V_{out}$ to ramp up faster.

Providing additional pre-drive current for a large load capacitance $C_{load}$ reduces variation in the slew rate of the driver 210 across a range of load capacitances. This is because, without the additional pre-drive current, the large load capacitance $C_{load}$ would significantly reduce the slew rate of the driver 210 compared with the slew rate of the driver 210 for a small load capacitance $C_{load}$. Providing the additional pre-drive current to pre-drive the gate of the output transistor 215 for the large load capacitance $C_{load}$ reduces or eliminates the reduction in the slew rate caused by the large load capacitance $C_{load}$, resulting in a more uniform slew rate across the range of load capacitances.

Thus, the current sensor 240, the control circuit 250 and the second current source 235 provide slew-rate control for the driver 210 without the need for a large feedback capacitor $C_M$. This may reduce the area of the driver 210 because the current sensor 240, the control circuit 250 and the second current source 235 may occupy a smaller area than a large feedback capacitor $C_M$, especially for the case where the chip has a low capacitance density. Also, eliminating the need for a large feedback capacitor $C_M$ may reduce power consumption. As discussed above, a large feedback capacitor $C_M$ may require a large pre-drive current to achieve a desired slew rate based on equation (1). Without the large feedback capacitor $C_M$, the driver 210 is able to achieve the desired slew rate using a smaller pre-drive current resulting in a more power-efficient driver.

It is to be appreciated that the driver 210 is not limited to two current sources and may include more than two current sources. For example, in some implementations, the driver 210 may include multiple current sources configured to selectively provide additional pre-drive current for the output transistor 215 based on the sensed output current. In these implementations, each of the multiple current sources may have a respective threshold. For each of the multiple current sources, the control circuit 250 may be configured to enable the current source if the sensed output current is above the respective threshold and disable the current source if the sensed output current is below the respective threshold. The thresholds for the multiple current sources may be the same or different.

In some implementations, the control circuit 250 may enable the second current source 235 if the sensed output current is equal to the threshold, and, in other implementations, the control circuit 250 may disable the second current source 235 if the sensed output current is equal to the threshold.

Figure 3:
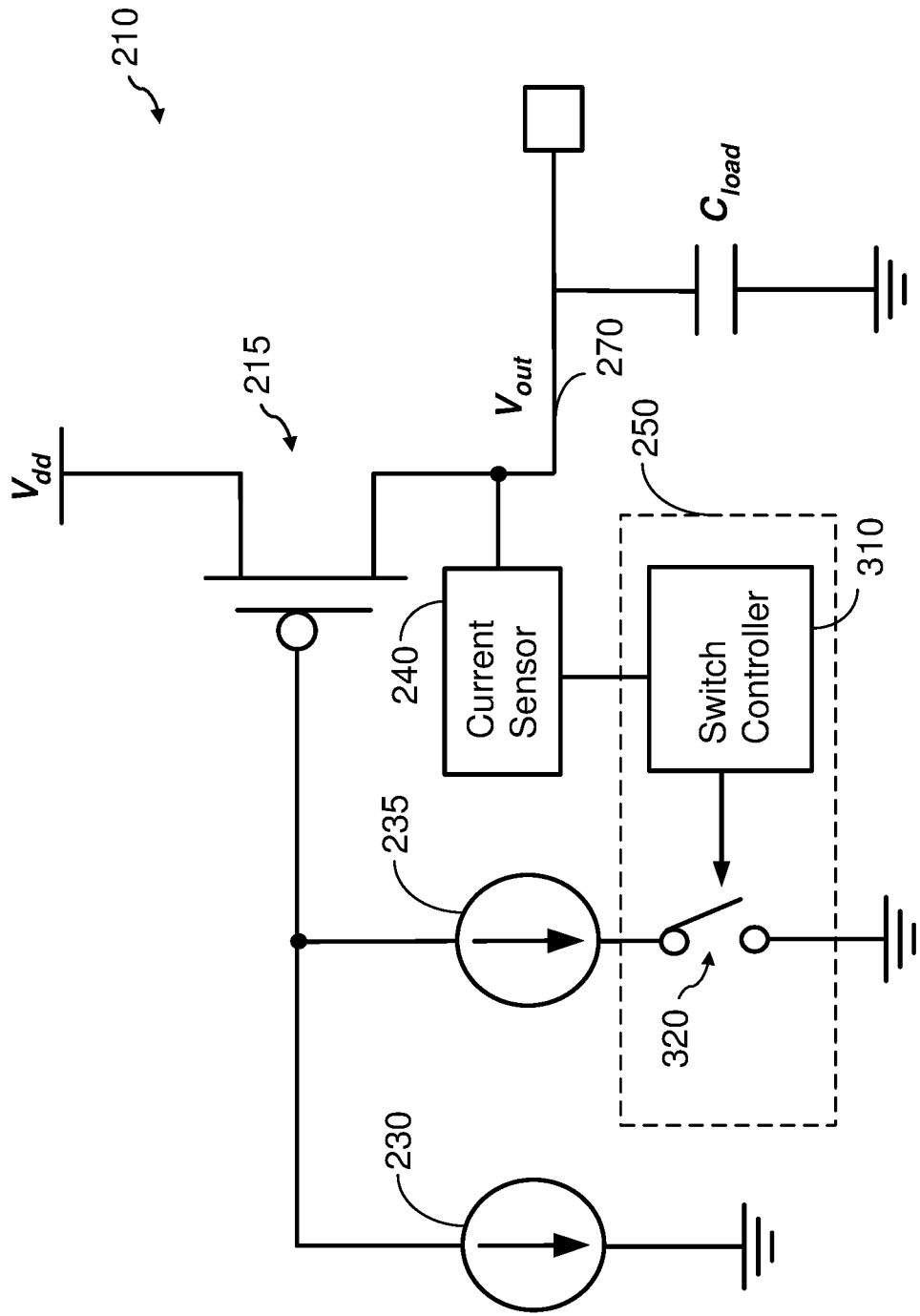
FIG. 3 shows an exemplary implementation of a control circuit according to certain aspects of the present disclosure.

FIG. 3 shows an exemplary implementation of the control circuit 250 according to certain aspects. In this example, the control circuit 250 includes a switch 320 and a switch controller 310. The switch 320 may be implemented with a transistor or another type of switch. The switch 320 is coupled in series with the second current source 235. In the example shown in FIG. 3, the switch 320 is coupled between the second current source 235 and the ground rail. However, it is to be appreciated that, in other implementations, the switch 320 may be coupled between the second current source 235 and the gate of the output transistor 215, and the second current source 235 may be coupled between the switch 320 and the ground rail. Coupling the switch 320 is series with the second current source 235 allows the switch controller 310 to enable or disable the second current source 235 by opening or closing the switch 320, as discussed further below.

The switch controller 310 is configured to enable or disable the second current source 235 by opening or closing the switch 320 based on the sensed output current from the current sensor 240. In one example, the switch controller 310 is configured to close the switch 320 if the sensed output current is above the threshold. In this case, closing the switch 320 enables the second current source 235 by coupling the second current source 235 to the ground rail, allowing the second current source 235 to sink current from the gate of the output transistor 215 to the ground rail. The switch controller 310 is configured to open the switch 320 if the sensed output current is below the threshold. In this case, opening the switch 320 disables the second current source 235 by decoupling the second current source 235 from the ground rail.

Figure 4:
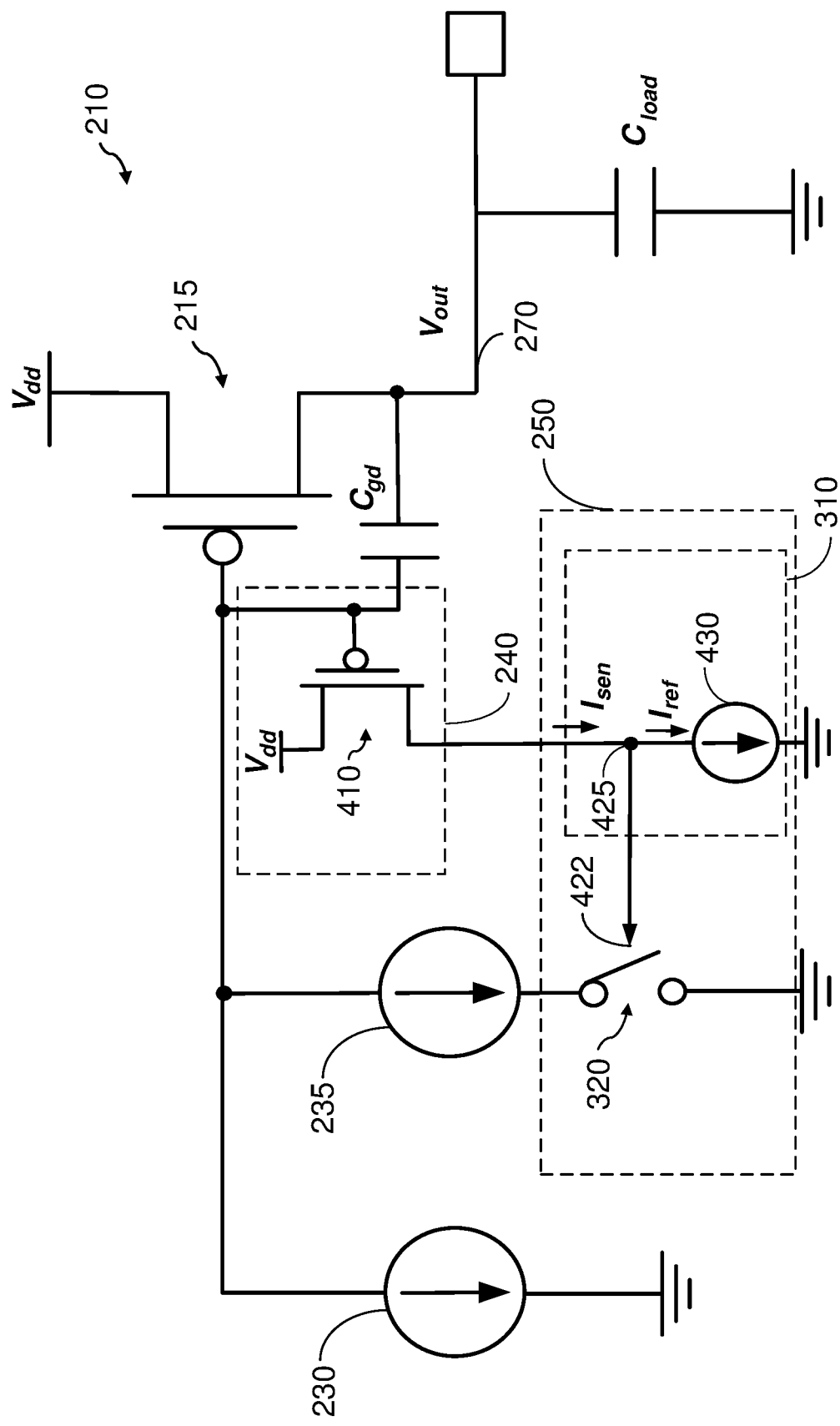
FIG. 4 shows an exemplary implementation of a current sensor and a switch controller according to certain aspects of the present disclosure.

FIG. 4 shows an exemplary implementation of the current sensor 240 and the switch controller 310 according to certain aspects. In this example, the current sensor 240 includes a current-sensing transistor 410. In the example in FIG. 4, the current-sensing transistor 410 is implemented with a PFET.

The gate of the current-sensing transistor 410 is coupled to the gate of the output transistor 215, the source of the current-sensing transistor 410 is coupled to the voltage supply rail $V_{dd}$, and the drain of the current-sensing transistor 410 is coupled to the switch controller 310. The gate of the current-sensing transistor 410 is capacitively coupled to the drain of the output transistor 215 via the gate-to-drain capacitance of the output transistor 215. The gate-to-drain capacitance of the output transistor 215 is represented as capacitor $C_{gd}$ in FIG. 4. It is to be appreciated that the gate-to-drain capacitance of the output transistor 215 comes from the structure of the output transistor 215 and not from a separate capacitor coupled to the output transistor 215.

In this example, the current-sensing transistor 410 forms a current mirror with the output transistor 215 causing the current-sensing transistor 410 to generate a sense current $I_{sen}$ that is proportional to the output current of the driver 210. Because the sense current $I_{sen}$ is proportional to the output current of the driver 210, the sense current $I_{sen}$ provides the switch controller 310 with information on the output current of the driver 210. In this example, the sense current $I_{sen}$ provides the sensed output current discussed above. In certain aspects, the sense current $I_{sen}$ is a scaled-down version of the output current, which may be achieved by making the channel width of the current-sensing transistor 410 smaller than the channel width of the output transistor 215.

In this example, the switch controller 310 includes a reference current source 430 configured to generate a reference current $I_{ref}$. As discussed further below, the threshold of the switch controller 310 discussed above may be set by the reference current $I_{ref}$. The current-sensing transistor 410 and the reference current source 430 are coupled at a node 425. In the example in FIG. 4, the drain of the current-sensing transistor 410 is coupled to the node 425. The node 425 is also coupled to a control input 422 of the switch 320. In this example, the switch 320 may be configured to close when the voltage at the control input 422 is equal to or above a switch-trigger voltage, and open when the voltage at the control input 422 is below the switch-trigger voltage. For the example in which the switch 320 is implemented with a transistor, the control input 422 is located at the gate of the transistor and the switch-trigger voltage may be a function of the threshold voltage of the transistor. In the example in FIG. 4, the control input 422 of the switch 320 is coupled to the reference current source 430 and the current sensor 240 (e.g., the drain of the current-sensing transistor 410).

During a transition of the output 270 from low to high, the current-sensing transistor 410 generates the sense current $I_{sen}$, which is proportional to the output current of the driver 210. The sense current $I_{sen}$ is compared with the reference current $I_{ref}$ at the node 425. If the sense current $I_{sen}$ is less than the reference current $I_{ref}$, then the reference current $I_{ref}$ may keep the voltage at the node 425 below the switch-trigger voltage. In this case, the switch 320 is open and the second current source 235 is disabled. If the sense current $I_{sen}$ is greater than the reference current $I_{ref}$, then the sense current $I_{sen}$ may charge a capacitance (not shown) at the node 425, causing the voltage at the node 425 to rise above the switch-trigger voltage. In this case, the switch 320 is closed and the second current source 235 is enabled. The capacitance at the node 425 may include a capacitance at the control input 422 of the switch 320 and/or another capacitance. Thus, in this example, the switch controller 310 enables the second current source 235 if the sense current $I_{sen}$ is greater than the reference current $I_{ref}$ and disables the second current source 235 if the sense current $I_{sen}$ is less than the reference current $I_{ref}$. In this example, the threshold of the switch controller 310 may be set to a desired threshold by setting the reference current $I_{ref}$ according to the desired threshold.

It is to be appreciated that the switch controller 310 is not limited to the exemplary implementation shown in FIG. 4. For example, in another implementation, the switch controller 310 may include a sense resistor coupled between the node 425 and the ground rail. In this example, the sense resistor may convert the sense current $I_{sen}$ into a sense voltage at the node 425, which closes the switch 320 (and hence enables the second current source 235) when the sense voltage reaches the switch-trigger voltage discussed above. In this example, the threshold of the control circuit 250 may be set by setting the resistance of the sense resistor according to a desired threshold.

Figure 5:
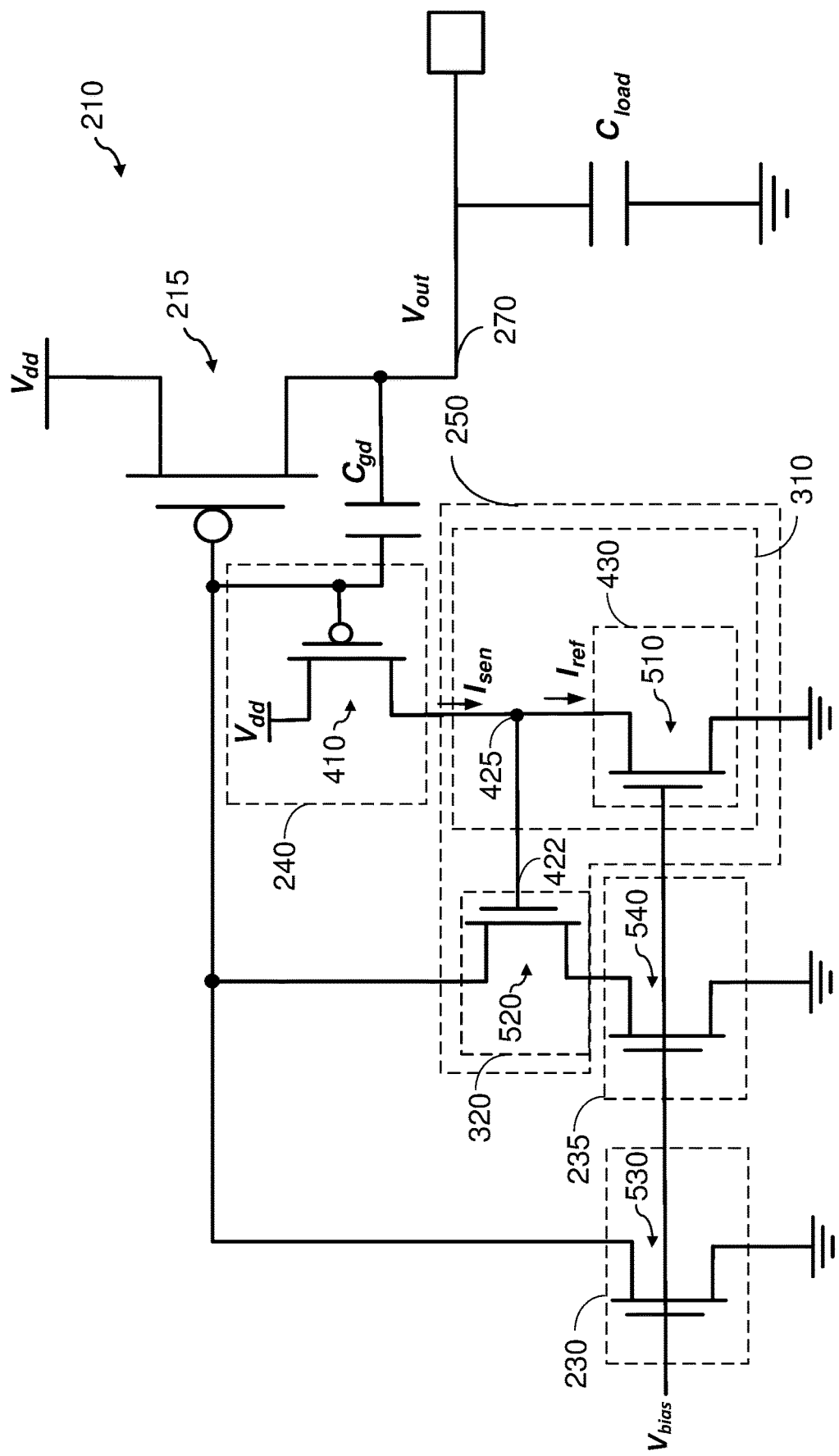
FIG. 5 shows an exemplary implementation of current sources and a switch according to certain aspects of the present disclosure.

FIG. 5 shows an exemplary implementation of the reference current source 430, the switch 320, the first current source 230, and the second current source 235 according to certain aspects.

In this example, the reference current source 430 is implemented with a reference-current transistor 510, in which the gate of the reference-current transistor 510 is biased by a gate voltage bias (labeled "$V_{bias}$"). In the example shown in FIG. 5, the reference-current transistor 510 is implemented with an NFET, in which the drain of the reference-current transistor 510 is coupled to the node 425 (e.g., drain of the current-sensing transistor 410) and the source of the reference-current transistor 510 is coupled to the ground rail. In this example, the reference current $I_{ref}$ is set by the gate voltage bias $V_{bias}$ and the channel width of the reference-current transistor 510.

In this example, the first current source 230 is implemented with a first current-source transistor 530 and the second current source 235 is implemented with a second current-source transistor 540. In the example shown in FIG. 5, the first current-source transistor 530 and the second current-source transistor 540 are each implemented with an NFET. The gate of the first current-source transistor 530 and the gate of the second current-source transistor 540 may both be biased by the voltage bias $V_{bias}$, as shown in FIG. 5. In this example, the current of the first current-source transistor 530 and the current of the second current-source transistor 540 may be set independently, for example, by independently setting the channel width of the first current-source transistor 530 and the channel width of the second current-source transistor 540.

In the example in FIG. 5, the gates of the reference-current transistor 510, the first current-source transistor 530, and the second current-source transistor 540 are biased by a common gate voltage bias $V_{bias}$. However, it is to be appreciated that the present disclosure is not limited to this example, and that, in other implementations, the gates of the reference-current transistor 510, the first current-source transistor 530, and the second current-source transistor 540 may be biased by different bias voltages.

In this example, the switch 320 is implemented with a switching transistor 520. The gate of the switching transistor 520 is coupled to the node 425 and provides the control input 422 of the switch 320. In the example in FIG. 5, the switching transistor 520 is implemented with an NFET, in which the drain of the switching transistor 520 is coupled to the gate of the output transistor 215, and the source of the switching transistor 520 is coupled to the second current source 235. In this example, the switch-trigger voltage of the switch 320 corresponds to a voltage at the control input 422 at which the gate-to-source voltage of the switching transistor 520 is equal to or greater than the threshold voltage of the switching transistor 520.

In the example in FIG. 5, the positions of the switch 320 and the second current source 235 are switched relative to the positions of the switch 320 and the second current source 235 in FIGS. 3 and 4. In both cases, the switch 320 and the second current source 235 are coupled in series between the gate of the transistor 215 and the ground rail, in which the second current source 235 is enabled when the switch 320 is closed and disabled when the switch 320 is opened.

Figure 6A:
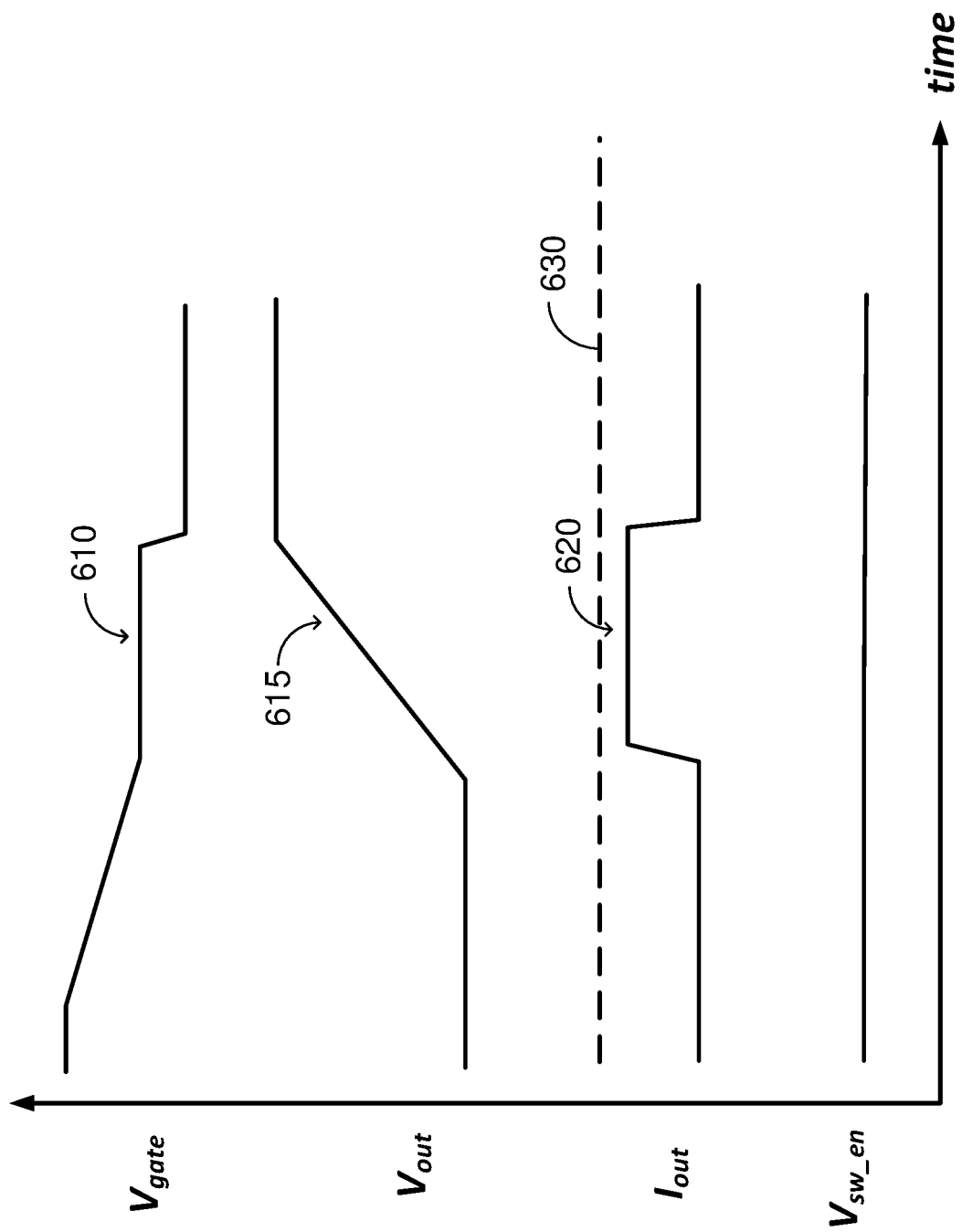
FIG. 6A shows an exemplary timing diagram for a case where a driver is driving a small capacitive load according to certain aspects of the present disclosure.

FIG. 6A is a timing diagram showing an example of the gate voltage (labeled "$V_{gate}$"), the output voltage $V_{out}$, the output current (labeled "$I_{out}$"), and the voltage at the control input 422 of the switch 320 (labeled "$V_{sw\_eu}$") during a transition from low to high for the case where a small capacitance load $C_{load}$ is coupled to the output 270. At the start of the transition, the pre-drive current of the first current source 230 causes the gate voltage $V_{gate}$ of the output transistor 215 to ramp down. Eventually, the output transistor 215 (which is implemented with a PFET) turns on and output current $I_{out}$ begins to flow from the output 270 of the driver 210 to the load capacitance $C_{load}$, causing the output voltage $V_{out}$ to ramp up. Capacitive feedback provided by the gate-to-drain capacitance $C_{gd}$ of the output transistor 215 then causes the output voltage $V_{out}$ to ramp up 615 at a slew rate of approximately $I_s/C_{gd}$ (e.g., based on equation (1)). During this time, the capacitive feedback holds the gate voltage $V_{gate}$ at an approximately constant voltage 610 that results in the slew rate of approximately $I_s/C_{gd}$. Also, during this time, the output current $I_{out}$ is at an approximately constant current level 620. In this example, the output current $I_{out}$ is below the current level 630 needed for the sensed output current to cause the control circuit 250 to enable the second current source 235. In other words, the detected load capacitance is too small to enable the additional pre-drive current from the second current source 235 in this example.

Figure 6B:
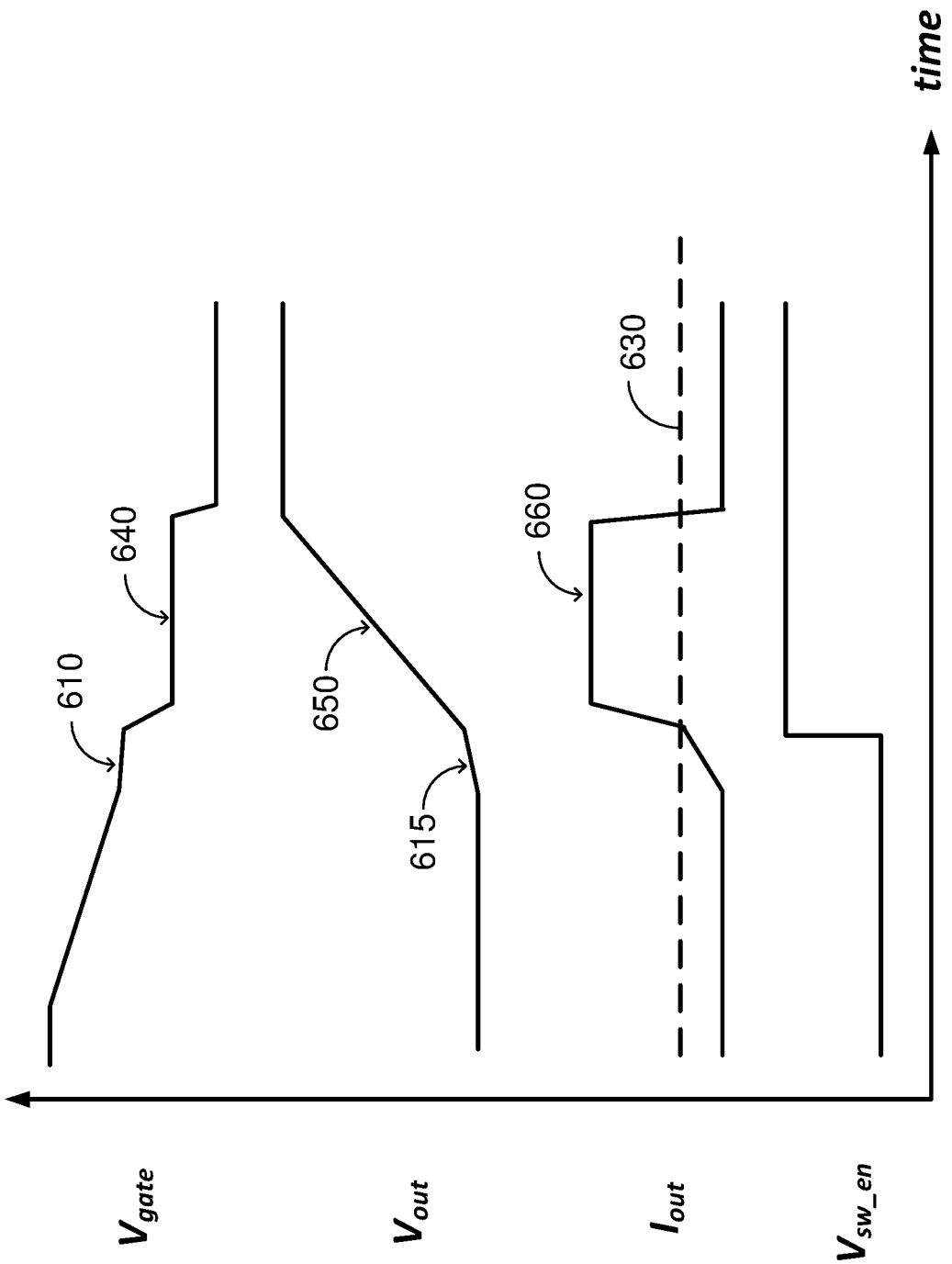
FIG. 6B shows an exemplary timing diagram for a case where a driver is driving a large capacitive load according to certain aspects of the present disclosure.

FIG. 6B is a timing diagram showing an example of the gate voltage (labeled "$V_{gate}$"), the output voltage $V_{out}$, the output current (labeled "$I_{out}$"), and the voltage at the control input 422 of the switch 320 (labeled "$V_{sw\_eu}$") during a transition from low to high for the case where a large capacitance load $C_{load}$ is coupled to the output 270. At the start of the transition, the pre-drive current of the first current source 230 causes the gate voltage $V_{gate}$ of the output transistor 215 to ramp down. Eventually, the output transistor 215 (which is implemented with a PFET) turns on and output current $I_{out}$ begins to flow from the output 270 of the driver 210 to the load capacitance $C_{load}$, causing the output voltage $V_{out}$ to ramp up.

In this example, the capacitance of the gate-to-drain capacitance $C_{gd}$ is too small to provide enough loop gain to control the slew rate of the driver 210 for the large capacitive load. As a result, the output voltage $V_{out}$ initially ramps up 615 at a much slower rate than the case for the small capacitance load illustrated in FIG. 6A.

In this example, the output current $I_{out}$ rises above the current level 630 needed for the sensed output current to cause the control circuit 250 to enable the second current source 235. In other words, the detected load capacitance is large enough to enable the additional pre-drive current from the second current source 235. The additional pre-drive current from the second current source 235 pulls down the gate voltage $V_{gate}$ of the output transistor 215 to a lower voltage 640, which increases the output current $I_{out}$ to a higher current level 660 and causes the output voltage $V_{out}$ to ramp up at a faster rate (e.g., to a rate comparable to the rate for the case of the small capacitive load in FIG. 6A). As a result, the slew rate for the large capacitive load is similar to the slew rate for the small capacitive load in FIG. 6A. Without the additional pre-drive current, the slew rate for the large capacitive load would be significantly slower than the slew rate for the small capacitive load in FIG. 6A. Thus, the additional pre-drive current from the second current source 235 provides slew-rate control for the case of the large capacitive load without the need for the large feedback capacitor $C_M$.

Figure 7:
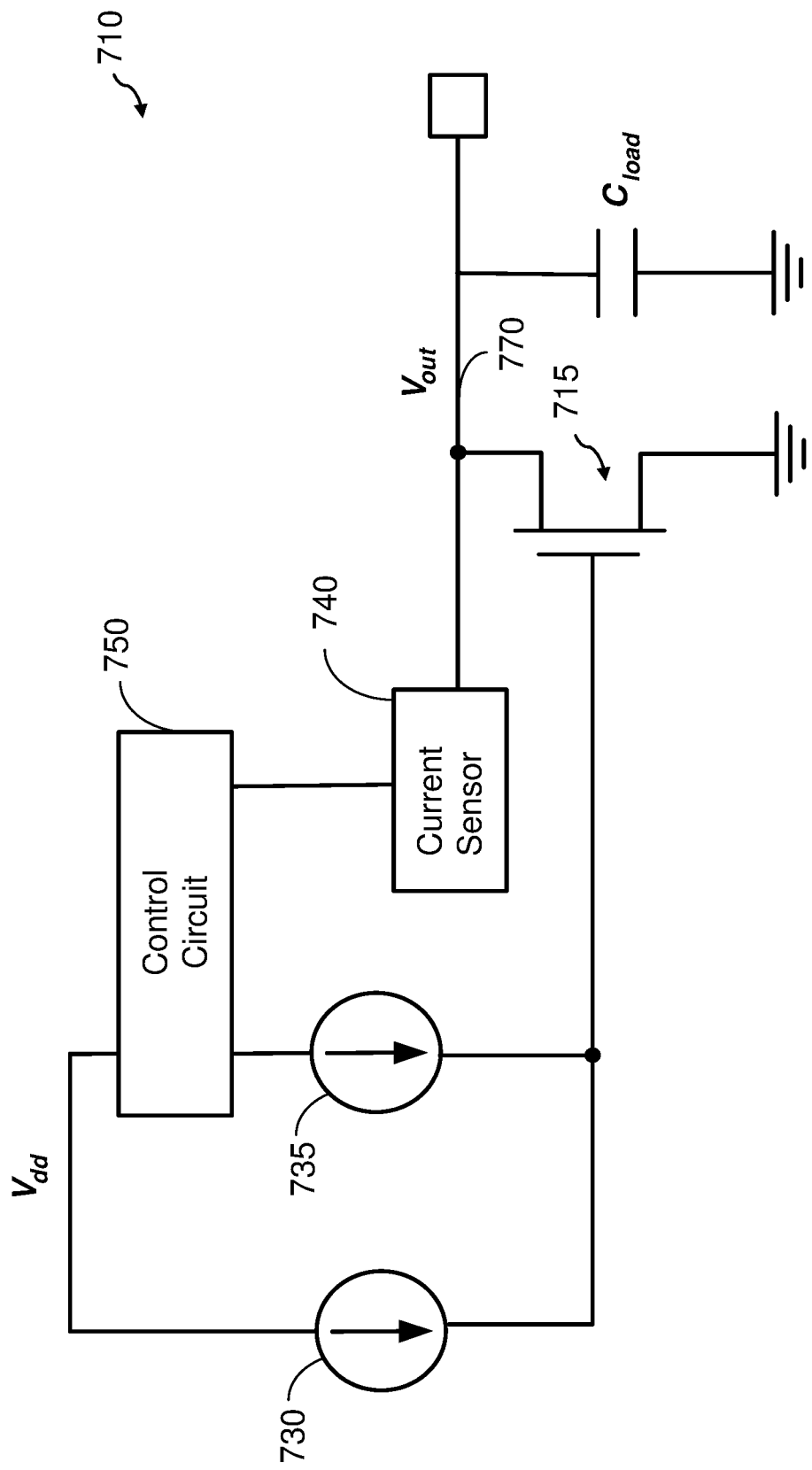
FIG. 7 shows another example of a slew-rate controlled driver according to certain aspects of the present disclosure.

FIG. 7 shows another exemplary slew-rate controlled driver 710 according to aspects of the present disclosure. The driver 710 is configured to drive the output 770 low (i.e., pull down the output 770).

The driver 710 includes an output transistor 715 and a first current source 730. The output transistor 715 is implemented with an NFET coupled between the output 770 of the driver 710 and the ground rail. More particularly, the drain of the output transistor 715 is coupled to the output 770 and the source of the output transistor 715 is coupled to the ground rail. As discussed above, the ground rail is represented by the ground symbol in the drawings. The first current source 730 is coupled to the gate of the output transistor 215 and is configured to source current from voltage supply rail $V_{dd}$ to the gate of the output transistor 715 to pre-drive the gate of the output transistor 715 high.

The driver 710 also includes a second current source 735, a current sensor 740, and a control circuit 750. The second current source 735 is selectively enabled or disabled by the control circuit 750, as discussed further below. When enabled by the control circuit 750, the second current source 735 is configured to source current to the gate of the output transistor 715. In certain aspects, the control circuit 750 enables the second current source 735 to provide additional pre-drive current when a large capacitance load is detected at the output 770, as discussed further below.

The current sensor 740 is configured to sense the output current of the driver 710. In this example, the output current refers to the current flowing through the output transistor 715 to ground. The sensed output current provided by the current sensor 740 allows the control circuit 750 to detect a large load capacitance $C_{load}$ at the output 770. This is because a larger load capacitance $C_{load}$ increases the output current of the driver 710 since more current is discharged from the larger load capacitance $C_{load}$. Thus, the sensed output current provides information on the load capacitance $C_{load}$, allowing the control circuit 750 to indirectly detect a large load capacitance $C_{load}$ based on the sensed output current.

The control circuit 750 is coupled to the current sensor 740 and the second current source 735. In one example, the control circuit 750 is configured to enable the second current source 735 if the sensed output current from the current sensor 740 is above a threshold. In this case, a sensed output current above the threshold may indicate a large load capacitance $C_{load}$ coupled to the output 770. Thus, in this example, the second current source 735 is enabled when a large load capacitance $C_{load}$ is detected based on the sensed output current. The control circuit 750 is configured to disable the second current source 735 if the sensed output current from the current sensor 740 is below the threshold.

Exemplary operations of the driver 710 will now be discussed according to certain aspects for the case where the driver 710 transitions the output 770 from high to low. In this case, it is assumed that the gate of the output transistor 715 is initially low (e.g., approximately ground) and the output 770 is initially high (e.g., approximately $V_{dd}$). The gate of the output transistor 715 may be initially set low, for example, by closing a switch (not shown) between the gate of the output transistor 215 and the ground rail, and then opening the switch before the transition from high to low. The output 770 may be initially set high, for example, by the exemplary driver 210 shown in FIG. 2.

To transition the output 770 from high to low, the first current source 730 sources current to the gate of the output transistor 715, which pre-drives the gate of the output transistor 715 high. Since the output transistor 715 is implemented with an NFET, this causes the output transistor 715 to turn on, allowing current to flow from the output 770 of the driver 710 to the ground rail through the output transistor 715. The current flowing to the ground rail through the output transistor 715 discharges the load capacitance $C_{load}$, causing the output voltage (labeled "$V_{out}$") to ramp down.

During the transition from high to low, the current sensor 740 senses the output current of the driver 710 and communicates the sensed output current to the control circuit 750. In this example, the output current flows from the output 770 to ground to pull the output 770 low.

When the sensed output current is below the threshold, the control circuit 750 disables the second current source 735, in which case the second current source 735 does not provide additional pre-drive current.

When the sensed output current rises above the threshold, the control circuit 750 enables the second current source 735 to provide additional pre-drive current. This may occur, for example, when a large load capacitance $C_{load}$ is coupled to the output 770. The additional pre-drive current raises the gate voltage of the output transistor 715 higher, which increases the current flowing through the output transistor 715 to discharge the large load capacitance $C_{load}$ and causes the output voltage $V_{out}$ to ramp down faster.

Providing additional pre-drive current for a large load capacitance $C_{load}$ reduces variation in the slew rate of the driver 710 across a range of load capacitances. This is because, without the additional pre-drive current, the large load capacitance $C_{load}$ would significantly reduce the slew rate of the driver 710 compared with the slew rate of the driver 710 for a small load capacitance $C_{load}$. Providing the additional pre-drive current to pre-drive the gate of the output transistor 715 for the large load capacitance $C_{load}$ reduces or eliminates the reduction in the slew rate caused by the large load capacitance $C_{load}$, resulting in a more uniform slew rate across the range of load capacitances.

Thus, the current sensor 740, the control circuit 750 and the second current source 735 provide slew-rate control for the driver 710 without the need for a large feedback capacitor $C_M$. This may reduce the area of the driver 710 because the current sensor 740, the control circuit 750 and the second current source 735 may occupy a smaller area than a large feedback capacitor $C_M$, especially for the case where the chip has a low capacitance density. Also, eliminating the need for a large feedback capacitor $C_M$ may reduce power consumption. As discussed above, a large feedback capacitor $C_M$ may require a large pre-drive current to achieve a desired slew rate based on equation (1). Without the large feedback capacitor $C_M$, the driver 710 is able to achieve the desired slew rate using a smaller pre-drive current resulting in a more power-efficient driver.

It is to be appreciated that the driver 710 is not limited to two current sources and may include more than two current sources. For example, in some implementations, the driver 710 may include multiple current sources configured to selectively provide additional pre-drive current for the output transistor 715 based on the sensed output current. In these implementations, each of the multiple current sources may have a respective threshold. For each of the multiple current sources, the control circuit 750 may be configured to enable the current source if the sensed output current is above the respective threshold and disable the current source if the sensed output current is below the respective threshold. The thresholds for the multiple current sources may be the same or different.

In some implementations, the control circuit 750 may enable the second current source 735 if the sensed output current is equal to the threshold, and, in other implementations, the control circuit 750 may disable the second current source 735 if the sensed output current is equal to the threshold.

Figure 8:
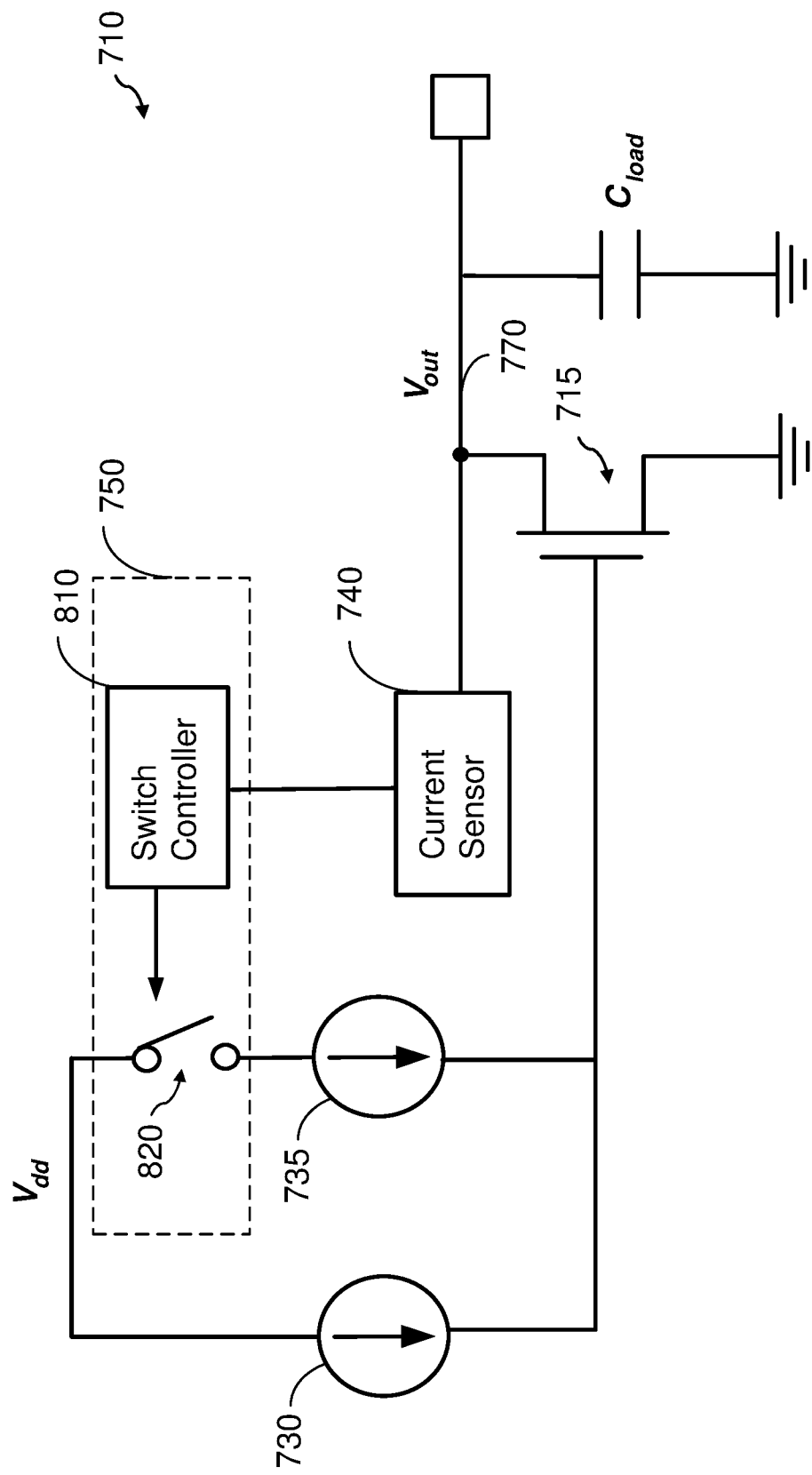
FIG. 8 shows another exemplary implementation of a control circuit according to certain aspects of the present disclosure.

FIG. 8 shows an exemplary implementation of the control circuit 750 according to certain aspects. In this example, the control circuit 750 includes a switch 820 and a switch controller 810. The switch 820 may be implemented with a transistor or another type of switch. The switch 820 is coupled in series with the second current source 735. In the example shown in FIG. 8, the switch 820 is coupled between the second current source 835 and the voltage supply rail $V_{dd}$. However, it is to be appreciated that, in other implementations, the switch 820 may be coupled between the second current source 735 and the gate of the output transistor 715, and the second current source 735 may be coupled between the voltage supply rail $V_{dd}$ and the switch 820.

The switch controller 810 is configured to enable or disable the second current source 735 by opening or closing the switch 720 based on the sensed output current from the current sensor 740. In one example, the switch controller 810 is configured to close the switch 820 if the sensed output current is above the threshold. In this case, closing the switch 820 enables the second current source 735 by coupling the second current source 735 to the voltage supply rail $V_{dd}$, allowing the second current source 735 to source current from the voltage supply rail $V_{dd}$ to the gate of the output transistor 715. The switch controller 810 is configured to open the switch 820 if the sensed output current is below the threshold. In this case, opening the switch 820 disables the second current source 735 by decoupling the second current source 735 from the voltage supply rail $V_{dd}$.

Figure 9:
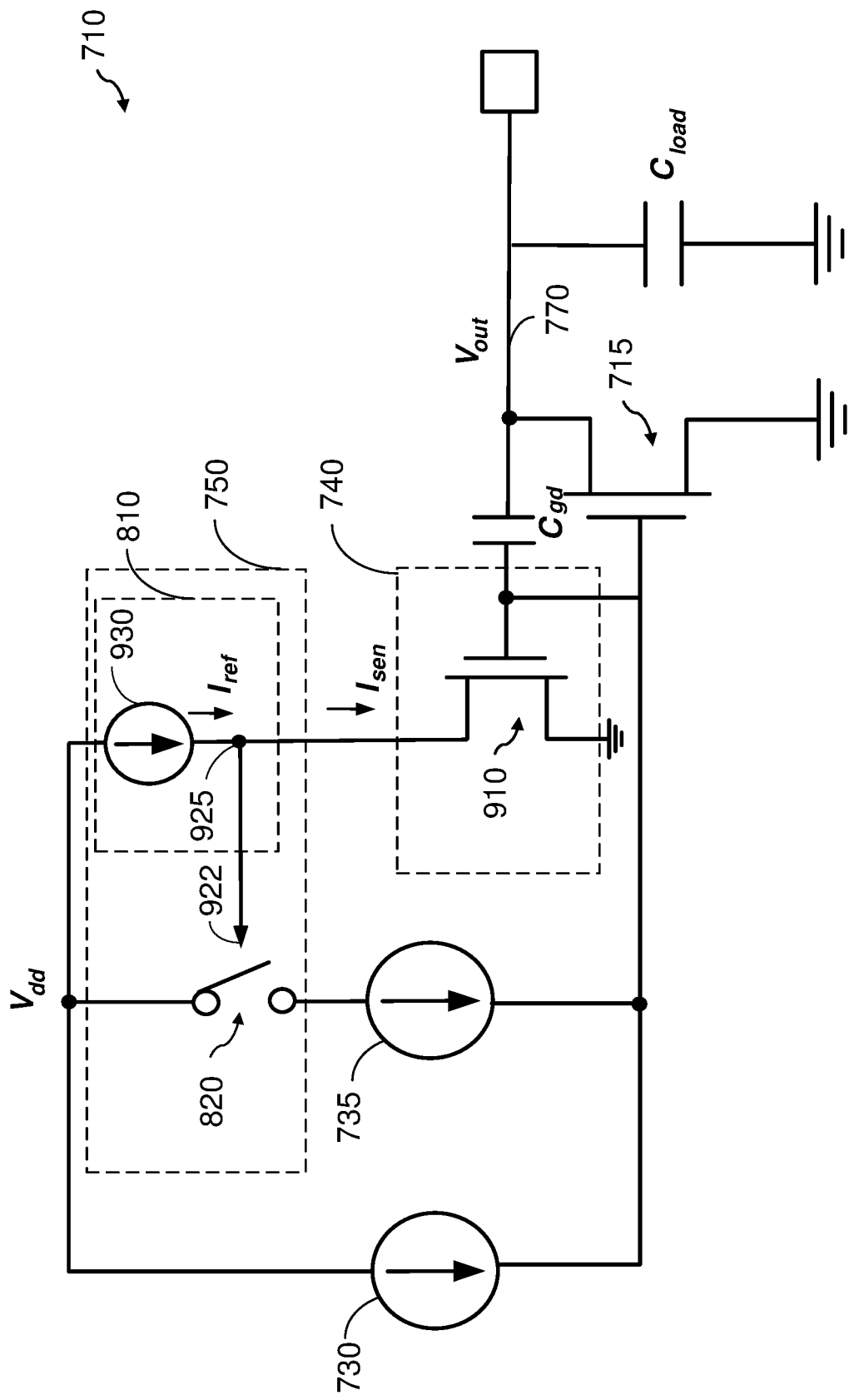
FIG. 9 shows another exemplary implementation of a current sensor and a switch controller according to certain aspects of the present disclosure.

FIG. 9 shows an exemplary implementation of the current sensor 740 and the switch controller 810 according to certain aspects. In this example, the current sensor 740 includes a current-sensing transistor 910. In the example in FIG. 9, the current-sensing transistor 910 is implemented with an NFET. The gate of the current-sensing transistor 910 is coupled to the gate of the output transistor 715, the source of the current-sensing transistor 910 is coupled to the ground rail, and the drain of the current-sensing transistor 910 is coupled to the switch controller 810. The gate of the current-sensing transistor 910 is capacitively coupled to the drain of the output transistor 715 via the gate-to-drain capacitance of the output transistor 715. The gate-to-drain capacitance of the output transistor 715 is represented as capacitor $C_{gd}$ in FIG. 9. It is to be appreciated that the gate-to-drain capacitance of the output transistor 715 comes from the structure of the output transistor 715 and not from a separate capacitor coupled to the output transistor 715.

In this example, the current-sensing transistor 910 forms a current mirror with the output transistor 715 causing the current-sensing transistor 910 to generate a sense current $I_{sen}$ that is proportional to the output current of the driver 710. Because the sense current $I_{sen}$ is proportional to the output current of the driver 710, the sense current $I_{sen}$ provides the switch controller 810 with information on the output current of the driver 710. The sense current $I_{sen}$ provides the sensed output current discussed above. In certain aspects, the sense current $I_{sen}$ is a scaled-down version of the output current, which may be achieved by making the channel width of the current-sensing transistor 910 smaller than the channel width of the output transistor 715.

In this example, the switch controller 810 includes a reference current source 930 configured to generate a reference current $I_{ref}$. As discussed further below, the threshold of the switch controller 810 discussed above may be set by the reference current $I_{ref}$. The current-sensing transistor 910 and the reference current source 930 are coupled at a node 925. In the example in FIG. 9, the drain of the current-sensing transistor 910 is coupled to the node 925. The node 925 is also coupled to a control input 922 of the switch 820. In this example, the switch 820 may be configured to close when the voltage at the control input 922 falls below the supply voltage $V_{dd}$ by a switch-trigger voltage. For the example in which the switch 820 is implemented with a transistor, the control input 922 is located at the gate of the transistor and the switch-trigger voltage may be a function of the threshold voltage of the transistor. In the example in FIG. 9, the control input 922 of the switch 820 is coupled to the reference current source 930 and the current sensor 740 (e.g., the drain of the current-sensing transistor 910).

During a transition of the output 770 from high to low, the current-sensing transistor 910 generates the sense current $I_{sen}$, which is proportional to the output current of the driver 710. The sense current $I_{sen}$ is compared with the reference current $I_{ref}$ at the node 925. If the sense current $I_{sen}$ is less than the reference current $I_{ref}$, then the reference current $I_{ref}$ may keep the voltage at the node 925 close to the supply voltage $V_{dd}$. In this case, the switch 820 is open and the second current source 735 is disabled. If the sense current $I_{sen}$ is greater than the reference current $I_{ref}$, then the sense current $I_{sen}$ may discharge a capacitance (not shown) at the node 925, causing the voltage at the node 925 to fall by an amount equal to or greater than the switch-trigger voltage. In this case, the switch 820 is closed and the second current source 735 is enabled. The capacitance at the node 925 may include a capacitance at the control input 922 of the switch 820 and/or another capacitance. Thus, in this example, the switch controller 810 enables the second current source 735 if the sense current $I_{sen}$ is greater than the reference current $I_{ref}$ and disables the second current source 735 if the sense current $I_{sen}$ is less than the reference current $I_{ref}$. In this example, the threshold of the switch controller 810 may be set to a desired threshold by setting the reference current $I_{ref}$ according to the desired threshold.

It is to be appreciated that the switch controller 810 is not limited to the exemplary implementation shown in FIG. 9. For example, in another implementation, the switch controller 810 may include a sense resistor coupled between the node 925 and the voltage supply rail $V_{dd}$. In this example, the sense resistor may convert the sense current $I_{sen}$ into a sense voltage at the node 925, which closes the switch 820 (and hence enables the second current source 735) when the sense voltage at the node 925 falls below the supply voltage $V_{dd}$ by the switch-trigger voltage discussed above. In this example, the threshold of the control circuit 750 may be set by setting the resistance of the sense resistor according to a desired threshold.

Figure 10:
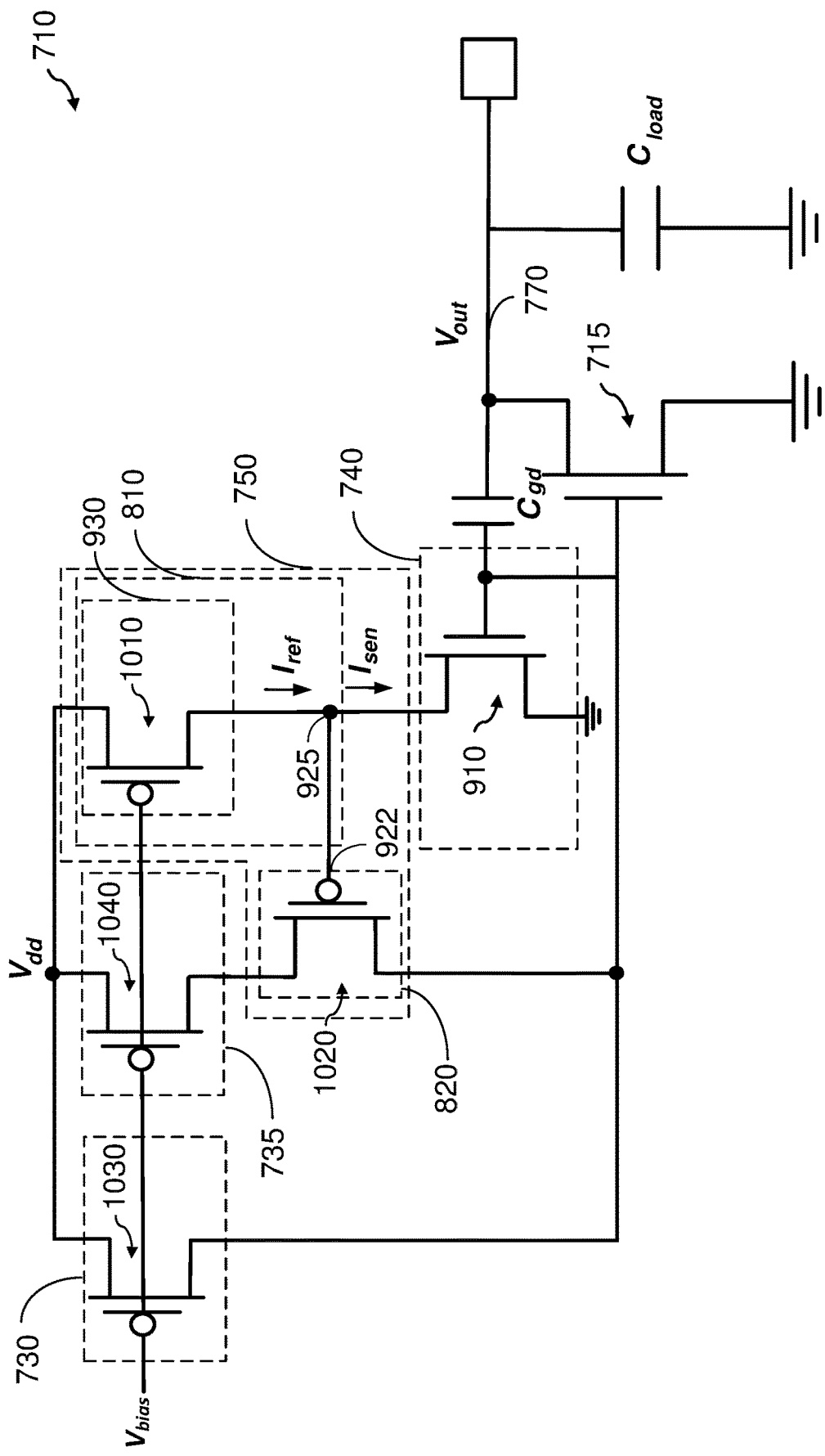
FIG. 10 shows another exemplary implementation of current sources and a switch according to certain aspects of the present disclosure.

FIG. 10 shows an exemplary implementation of the reference current source 930, the switch 820, the first current source 730, and the second current source 735 according to certain aspects.

In this example, the reference current source 930 is implemented with a reference-current transistor 1010, in which the gate of the reference-current transistor 1010 is biased by a gate voltage bias (labeled "$V_{bias}$"). The gate voltage bias may be different from the gate voltage bias in FIG. 5. In the example shown in FIG. 10, the reference-current transistor 1010 is implemented with a PFET, in which the drain of the reference-current transistor 1010 is coupled to the node 925 (e.g., drain of the current-sensing transistor 910) and the source of the reference-current transistor 1010 is coupled to the voltage supply rail $V_{dd}$. In this example, the reference current $I_{ref}$ is set by the gate voltage bias $V_{bias}$ and the channel width of the reference-current transistor 1010.

In this example, the first current source 730 is implemented with a first current-source transistor 1030 and the second current source 735 is implemented with a second current-source transistor 1040. In the example shown in FIG. 10, the first current-source transistor 1030 and the second current-source transistor 1040 are each implemented with a PFET. The gate of the first current-source transistor 1030 and the gate of the second current-source transistor 1040 may both be biased by the voltage bias $V_{bias}$, as shown in FIG. 10. In this example, the current of the first current-source transistor 1030 and the current of the second current-source transistor 1040 may be set independently, for example, by independently setting the channel width of the first current-source transistor 1030 and the channel width of the second current-source transistor 1040.

In the example in FIG. 10, the gates of the reference-current transistor 1010, the first current-source transistor 1030, and the second current-source transistor 1040 are biased by a common gate voltage bias $V_{bias}$. However, it is to be appreciated that the present disclosure is not limited to this example, and that, in other implementations, the gates of the reference-current transistor 1010, the first current-source transistor 1030, and the second current-source transistor 1040 may be biased by different bias voltages.

In this example, the switch 820 is implemented with a switching transistor 1020. The gate of the switching transistor 1020 is coupled to the node 925 and provides the control input 922 of the switch 820. In the example in FIG. 10, the switching transistor 1020 is implemented with an PFET, in which the drain of the switching transistor 1020 is coupled to the gate of the output transistor 715, and the source of the switching transistor 1020 is coupled to the second current source 735.

In the example in FIG. 10, the positions of the switch 820 and the second current source 735 are switched relative to the positions of the switch 820 and the second current source 735 in FIGS. 8 and 9. In both cases, the switch 820 and the second current source 735 are coupled in series between the gate of the transistor 715 and the voltage supply rail $V_{dd}$, in which the second current source 735 is enabled when the switch 820 is closed and disabled when the switch 820 is opened.

Figure 11:
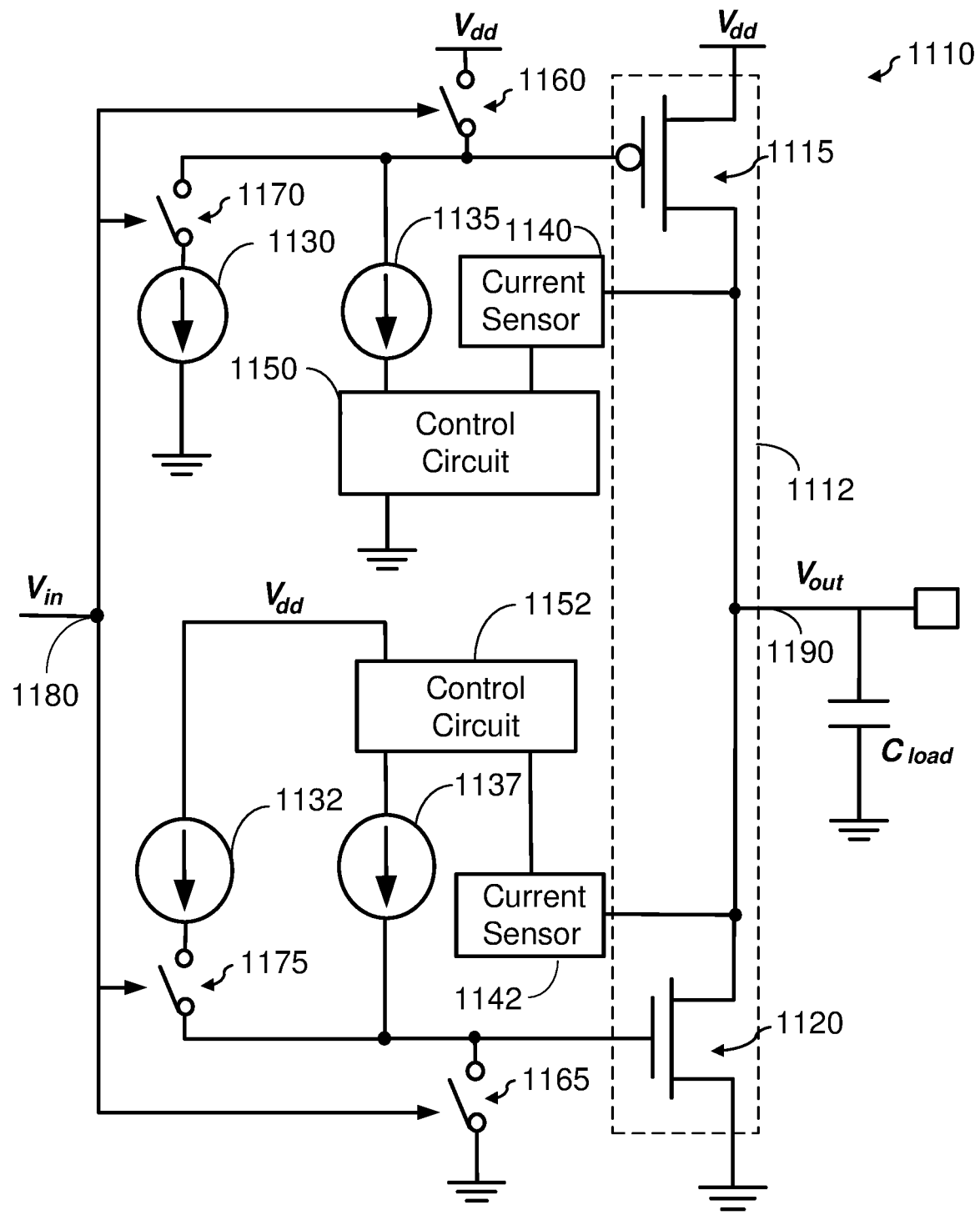
FIG. 11 shows an example of a slew-rate controlled driver configured to pull the driver output high or low based on an input voltage according to certain aspects of the present disclosure.

FIG. 11 shows an example of a slew-rate controlled driver 1110 configured to pull the driver output high or low based on an input voltage (labeled "$V_{in}$") according to certain aspects of the present disclosure. The driver 1110 combines the exemplary driver 210 in FIG. 2 and the exemplary driver 710 in FIG. 7, as discussed further below.

The driver 1110 includes an output stage 1112, a first current source 1130, a second current source 1135, a third current source 1132, a fourth current source 1137, a first current sensor 1140, a second current sensor 1142, a first control circuit 1150, a second control circuit 1152, a first switch 1160, a second switch 1165, a third switch 1170, and a fourth switch 1175. The on/off states of the first switch 1160, the second switch 1165, the third switch 1170, and the fourth switch 1175 are controlled by the input voltage at the input 1180 of the driver 1110, as discussed further below.

The output stage 1112 includes a first output transistor 1115 and a second output transistor 1120. In the example in FIG. 11, the first output transistor 1115 is implemented with a PFET coupled between the voltage supply rail $V_{dd}$ and the output 1190 of the driver 1110, and the second output transistor 1120 is implemented with an NFET coupled between the output 1190 of the driver 1110 and the ground rail. The first output transistor 1115 is configured to drive the output 1190 high (i.e., pull up the output 1190) and may correspond to the output transistor 215 in FIG. 2. The second output transistor 1120 is configured to drive the output 1190 low (i.e., pull down the output 1190) and may correspond to the output transistor 715 in FIG. 7, as discussed further below.

In this example, the first switch 1160 is coupled between the gate of the first output transistor 1115 and the voltage supply rail $V_{dd}$. The first current source 1130 and the third switch 1170 are coupled in series between the gate of the first output transistor 1115 and the ground rail. The second current source 1135 is selectively enabled or disabled by the first control circuit 1150, as discussed further below. The first current sensor 1140 is configured to sense the output current of the driver 1110 flowing through the first output transistor 1115.

The first control circuit 1150 is coupled to the first current sensor 1140 and the second current source 1135. In one example, the first control circuit 1150 is configured to enable the second current source 1135 if the sensed output current from the first current sensor 1140 is above a first threshold. In this case, a sensed output current above the first threshold may indicate a large load capacitance $C_{load}$ coupled to the output 1190. The first control circuit 1150 is configured to disable the second current source 1135 if the sensed output current from the first current sensor 1140 is below the first threshold.

The first current source 1130 may correspond to the first current source 230 shown in FIG. 2, the second current source 1135 may correspond to the second current source 235 shown in FIG. 2, the first current sensor 1140 may correspond to the current sensor 240 shown in FIG. 2, and the first control circuit 1150 may correspond to the control circuit 250 shown in FIG. 2. Accordingly, the descriptions of the first current source 230, the second current source 235, the current sensor 240, and the control circuit 250 given above are applicable to the first current source 1130, the second current source 1135, the first current sensor 1140, and the first control circuit 1150, respectively.

In this example, the second switch 1165 is coupled between the gate of the second output transistor 1120 and the ground rail. The third current source 1132 and the fourth switch 1175 are coupled in series between the gate of the voltage supply rail $V_{dd}$ and the gate of the second output transistor 1120. The fourth current source 1137 is selectively enabled or disabled by the second control circuit 1152, as discussed further below. The second current sensor 1142 is configured to sense the output current of the driver 1110 flowing through the second output transistor 1120.

The second control circuit 1152 is coupled to the second current sensor 1142 and the fourth current source 1137. In one example, the second control circuit 1152 is configured to enable the fourth current source 1137 if the sensed output current from the second current sensor 1142 is above a second threshold. In this case, a sensed output current above the second threshold may indicate a large load capacitance $C_{load}$ coupled to the output 1190. The second control circuit 1152 is configured to disable the fourth current source 1137 if the sensed output current from the second current sensor 1142 is below the second threshold. The first threshold and the second threshold may be the same or different.

The third current source 1132 may correspond to the first current source 730 shown in FIG. 7, the fourth current source 1137 may correspond to the second current source 735 shown in FIG. 7, the second current sensor 1142 may correspond to the current sensor 740 shown in FIG. 7, and the second control circuit 1152 may correspond to the control circuit 750 shown in FIG. 7. Accordingly, the descriptions of the first current source 730, the second current source 735, the current sensor 740, and the control circuit 750 given above are applicable to the third current source 1132, the fourth current source 1137, the second current sensor 1142, and the second control circuit 1152, respectively.

In operation, the driver 1110 is configured to drive the output 1190 high or low based on the input voltage at the input 1180 of the driver 1110. More particularly, the driver 1110 drives the output 1190 high when the input voltage has a first logic value and drives the output 1190 low when the input voltage has a second logic value. The first logic value may be low (e.g., approximately ground) and the second logic value may be high (e.g., approximately $V_{dd}$), or vice versa.

When the input voltage has the first logic value, the second switch 1165 is closed (i.e., turned on) and the first switch 1160 is opened (i.e., turned off). As a result, the gate of the second output transistor 1120 is coupled to the ground rail by the second switch 1165, which disables (i.e., turns off) the second output transistor 1120. In addition, the third switch 1170 is closed (i.e., turned on) and the fourth switch 1175 is opened (i.e., turned off). As a result, the first current source 1130 is coupled to the gate of the first output transistor 1115.

In this case, the first current source 1130, the second current source 1135, the first current sensor 1140, and the first control circuit 1150 are coupled in a similar configuration as the first current source 230, the second current source 235, the current sensor 240, and the control circuit 250, respectively, shown in FIG. 2.

The first current source 1130 sinks current from the gate of the first output transistor 1115 to pre-drive the gate of the first output transistor 1115 low, which turns on the first output transistor 1115. The first current sensor 1140 senses the output current of the driver 1110 flowing through the first output transistor 1115 and communicates the sensed output current to the first control circuit 1150. The first control circuit 1150 enables the second current source 1135 if the sensed output current from the first current sensor 1140 is above the first threshold. In this case, the second current source 1135 provides additional pre-drive current for the first output transistor 1115. The first control circuit 1150 disables the second current source 1135 if the sensed output current from the first current sensor 1140 is below the first threshold.

The first current sensor 1140, the first control circuit 1150, and the second current source 1135 provide slew-rate control for the transition of the output 1190 from low to high for the reasons given above for the current sensor 240, the control circuit 250, and the second current source 235. Accordingly, a detailed description of the slew-rate control is not repeated here for brevity. The first current sensor 1140 may be implemented with a current-sensing transistor (e.g., current-sensing transistor 410). The first control circuit 1150 may be implemented with any of the exemplary implementations shown in FIGS. 3 to 5.

When the input voltage has the second logic value, the second switch 1165 is opened (i.e., turned off) and the first switch 1160 is closed (i.e., turned on). As a result, the gate of the first output transistor 1115 is coupled to the voltage supply rail $V_{dd}$ by the first switch 1160, which disables (i.e., turns off) the first output transistor 1115. In addition, the third switch 1170 is opened (i.e., turned off) and the fourth switch 1175 is closed (i.e., turned on). As a result, the third current source 1132 is coupled to the gate of the second output transistor 1120.

In this case, the third current source 1132, the fourth current source 1137, the second current sensor 1142, and the second control circuit 1152 are coupled in a similar configuration as the first current source 730, the second current source 735, the current sensor 740, and the control circuit 750, respectively, shown in FIG. 7.

The third current source 1132 sources current to the gate of the second output transistor 1120 to pre-drive the gate of the second output transistor 1120 high, which turns on the second output transistor 1120. The second current sensor 1142 senses the output current of the driver 1110 flowing through the second output transistor 1120 and communicates the sensed output current to the second control circuit 1152. The second control circuit 1152 enables the fourth current source 1137 if the sensed output current from the second current sensor 1142 is above the second threshold. In this case, the fourth current source 1137 provides additional pre-drive current for the second output transistor 1120. The second control circuit 1152 disables the fourth current source 1137 if the sensed output current from the second current sensor 1142 is below the second threshold.

The second current sensor 1142, the second control circuit 1152, and the fourth current source 1137 provide slew-rate control for the transition of the output 1190 from high to low for the reasons given above for the current sensor 740, the control circuit 750, and the second current source 735. Accordingly, a detailed description of the slew-rate control is not repeated here for brevity. The second current sensor 1142 may be implemented with a current-sensing transistor (e.g., current-sensing transistor 910). The second control circuit 1152 may be implemented with any of the exemplary implementations shown in FIGS. 8 to 10.

Figure 12:
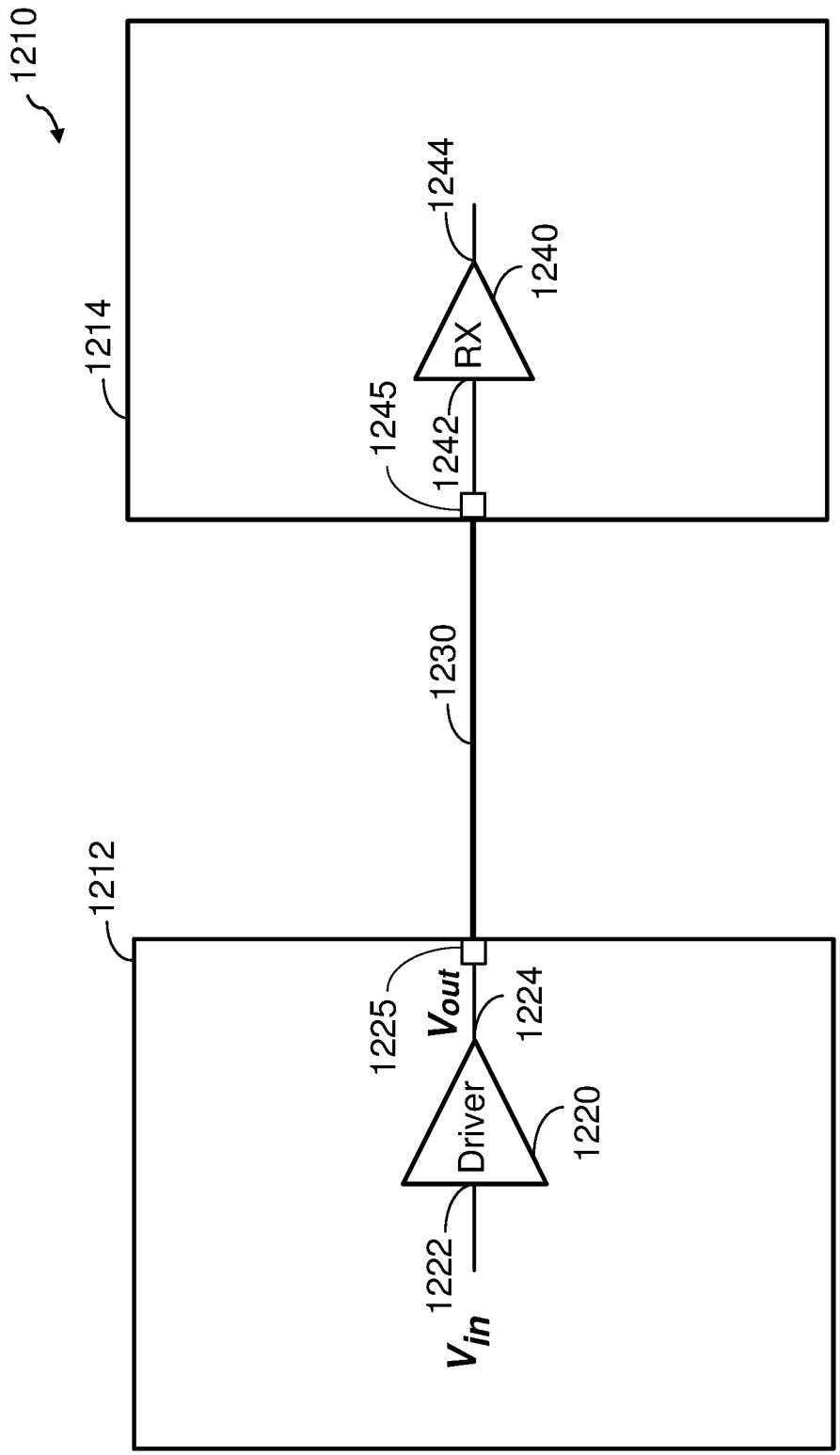
FIG. 12 shows an example of a driver configured to drive a transmission line according to certain aspects of the present disclosure.

FIG. 12 shows an example in which a driver 1220 is used to provide chip-to-chip communication between a first chip 1212 and a second chip 1214 in a system 1210 (e.g., a mobile device) according to certain aspects. The driver 1220 may include any one of the exemplary slew-rate controlled drivers 210, 710 and 1110 discussed above. In this example, the driver 1220 is integrated on the first chip 1212, and a corresponding receiver 1240 is integrated on the second chip 1214.

The output 1224 of the driver 1220 is coupled to a first pad 1225 on the first chip 1212, and the input 1242 of the receiver 1240 is coupled to a second pad 1245 on the second chip 1214. A transmission line 1230 is coupled between the first pad 1225 and the second pad 1245. The transmission line 1230 may include one or more metal traces on a substrate (e.g., a printed circuit board), a cable (e.g., coaxial cable), one or more wires, or any combination thereof.

In operation, an input signal (e.g., a data signal) to be transmitted to the second chip 1214 is input to the input 1222 of the driver 1220. The input signal has a voltage of $V_{in}$ in FIG. 12. The input signal may come from a processor (not shown) on the first chip 1212 or another device on the first chip 1212. The driver 1220 then drives the transmission line 1230 based on the input signal. The output of the driver 1220 has a voltage of $V_{out}$ in FIG. 12.

The receiver 1240 receives the signal from the output 1224 of the driver 1220 via the transmission line 1230 and processes the received signal. For example, the receiver 1240 may amplify the signal, equalize the signal (e.g., to compensate for signal distortion), sample the signal to recover data bits from the signal, etc. The receiver 1240 may output the resulting processed signal at the output 1244 to a processor (not shown) on the second chip 1214 for further processing.

In this example, the driver 1220 may implement slew-rate control according to any one or more aspects of the present disclosure to provide a more uniform slew-rate across a range of load capacitances. The load capacitance may include a capacitance of the transmission line 1230, a capacitance of the first pad 1225, etc.

Figure 13:
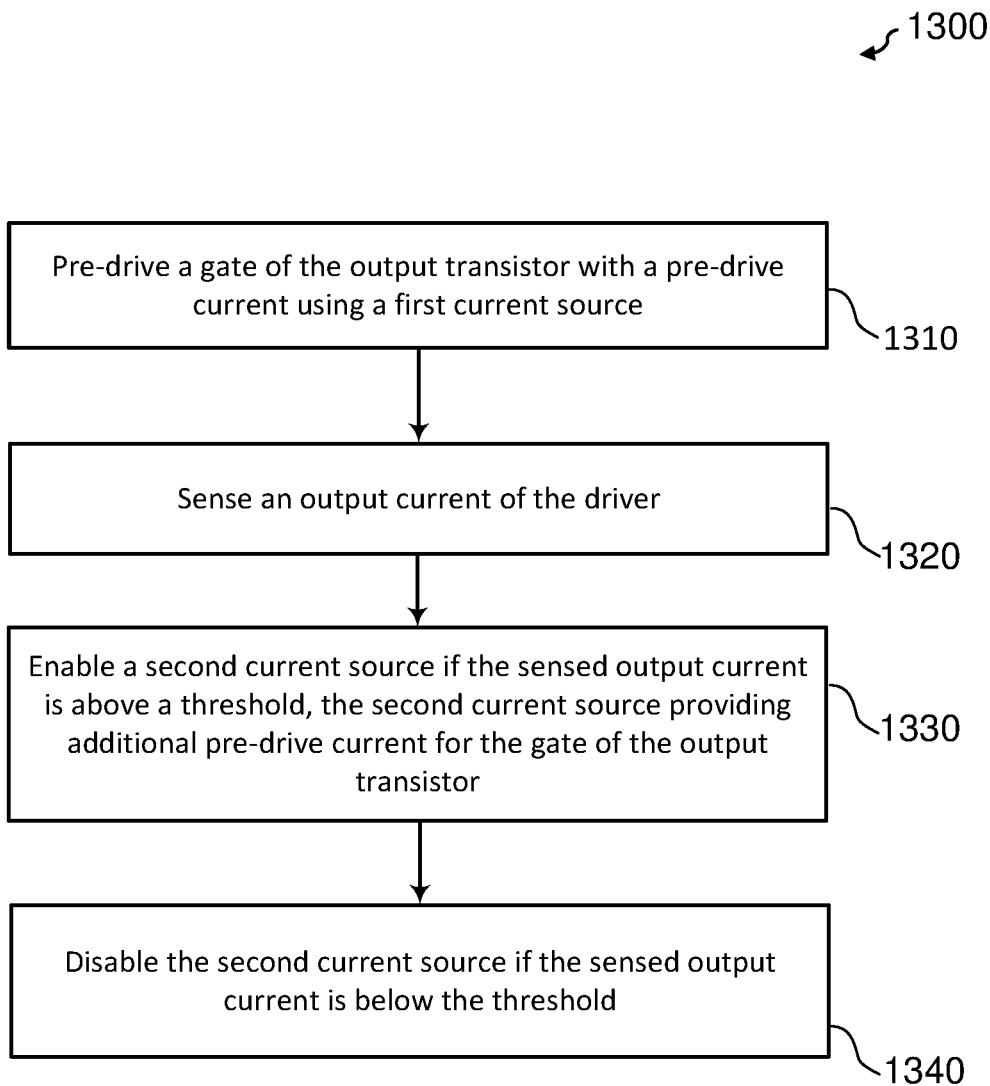
FIG. 13 is a flowchart illustrating a slew-rate control method according to certain aspects of the present disclosure.

FIG. 13 illustrates a slew-rate control method 1300 for a driver according to certain aspects. The driver includes an output transistor coupled between a rail and an output of the driver. The driver may correspond to the driver 210, 710 or 1110, the rail may be a voltage supply rail $V_{dd}$ or a ground rail, and the output transistor may correspond to output transistor 215, 715, 1115 or 1120.

At block 1310, a gate of the output transistor is pre-driven with a pre-drive current using a first current source. The first current source may correspond to the current source 230, 730, 1130 or 1132.

At block 1320, an output current of the driver is sensed. The output current may be sensed, for example, using the current sensor 240, 740, 1140 or 1142. In certain aspects, the output current is sensed while the gate of the output transistor is being pre-driven.

At block 1330, a second current source is enabled if the sensed output current is above a threshold, the second current source providing additional pre-drive current for the gate of the output transistor. The second current source may correspond to current source 235, 735, 1135 or 1137. The second current source may be enabled by the control circuit 250, 750, 1150 or 1152.

At block 1340, the second current source is disabled if the sensed output current is below the threshold. The second current source may be disabled by the control circuit 250, 750, 1150 or 1152.

In certain aspects, sensing the output current of the driver may include generating a sense current based on the output current. The sense current may be generated by a current-sensing transistor (e.g., current-sensing transistor 410 or 910). The sense current (e.g., $I_{sen}$) may be approximately proportional to the output current of the driver (e.g., a scaled-down version of the output current). In these aspects, the second current source may be enabled if the sense current is greater than a reference current (e.g., $I_{ref}$) and disabled if the sense current is less than the reference current. The reference current may be generated by a reference current source (e.g., reference current source 430 or 930).

It is to be appreciated that the present disclosure is not limited to the exemplary terminology used above to describe aspects of the present disclosure. For example, a driver may also be referred to as an output driver, a driving circuit, a pad driver, or another term. In another example, slew rate may also be referred to as transition time, rise/fall time, or another term. In another example, a rail can refer to a voltage supply rail, or in a specific case where the voltage supply is zero, a ground rail. Furthermore, a voltage supply rail may also be referred to as a power supply rail, a voltage rail, a power rail, etc.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples described herein but is to be accorded the widest scope consistent with the principles and novel features disclosed herein.

In the following further examples are described to facilitate the understanding of the invention.

In one example, a driver is described, the driver comprising an output transistor coupled between a first rail and an output of the driver, a first current source coupled to a gate of the output transistor, a second current source, a switch, wherein the switch and the second current source are coupled in series between the gate of the output transistor and a second rail, a current sensor configured to generate a sense current based on an output current of the driver and a reference current source configured to generate a reference current, wherein the current sensor and the reference current source are coupled to a control input of the switch. The current sensor may comprise a current-sensing transistor having a gate coupled to the gate of the output transistor, a drain coupled to the reference current source, and a source coupled to the first rail. The gate of the current-sensing transistor may be capacitively coupled to a drain of the output transistor. The first rail may comprise a voltage supply rail, and the output transistor may comprise a p-type field effect transistor having a source coupled to the voltage supply rail and a drain coupled to the output of the driver. The second current source may be configured to sink current from the gate of the output transistor. The second rail may comprise a ground rail. The first rail may comprise a ground rail, and the output transistor may comprise an n-type field effect transistor having a source coupled to the ground rail and a drain coupled to the output of the driver. Further, the second current source may be configured to source current to the gate of the output transistor. The second rail may comprise a voltage supply rail. Further, the reference current source may comprise a reference-current transistor having a drain coupled to the drain of the current-sensing transistor, a source coupled to the second rail, and a gate biased by a voltage bias. The switch may comprise a switching transistor, and the control input of the switch may be located at a gate of the switching transistor. The reference current source may comprise a reference-current transistor having a drain coupled to the current sensor, a source coupled to the second rail, and a gate biased by a voltage bias. Also, the switch may comprise a switching transistor, and the control input of the switch may be located at a gate of the switching transistor.

In another example, a driver is described, the driver comprising: an output transistor coupled between a rail and an output of the driver, a first current source coupled to a gate of the output transistor, a second current source configured to sink current from or source current to the gate of the output transistor when the second current source is enabled, a current sensor configured to sense an output current of the driver, and a control circuit coupled to the current sensor and the second current source, wherein the control circuit is configured to: enable the second current source if the sensed output current is above a threshold and disable the second current source if the sensed output current is below the threshold. The rail may comprise a voltage supply rail, and the output transistor may comprise a p-type field effect transistor having a source coupled to the voltage supply rail and a drain coupled to the output of the driver. The second current source may be configured to sink current from the gate of the output transistor when the second current source is enabled. The first current source may be configured to sink current from the gate of the output transistor. The rail may comprise a ground rail, and the output transistor may comprise an n-type field effect transistor having a drain coupled to the output of the driver and a source coupled to the ground rail. The second current source may be configured to source current to the gate of the output transistor when the second current source is enabled. The first current source may be configured to source current to the gate of the output transistor.

In yet another example, a slew-rate control method for a driver is described, the driver including an output transistor coupled between a rail and an output of the driver, the method comprising: pre-driving a gate of the output transistor with a pre-drive current using a first current source, sensing an output current of the driver, enabling a second current source if the sensed output current is above a threshold, the second current source providing additional pre-drive current for the gate of the output transistor and disabling the second current source if the sensed output current is below the threshold. The rail may comprise a voltage supply rail, and the output transistor may comprise a p-type field effect transistor having a source coupled to the voltage supply rail and a drain coupled to the output of the driver. The method may comprise decreasing a voltage at the gate of the output transistor by the additional pre-drive current. The rail may comprise a ground rail, and the output transistor may comprise an n-type field effect transistor having a drain coupled to the output of the driver and a source coupled to the ground rail. The method may comprise increasing a voltage at the gate of the output transistor by the additional pre-drive current. Sensing the output current of the driver may comprise generating a sense current based on the output current, enabling the second current source may comprise enabling the second current source if the sense current is greater than a reference current and disabling the second current source may comprise disabling the second current source if the sense current is less than the reference current. The sense current may be approximately proportional to the output current.

What is claimed is:

1. A driver, comprising:
    an output transistor coupled between a first rail and an output of the driver;
    a first current source coupled to a gate of the output transistor to provide a pre-drive current to the output transistor;
    a current sensor including a sensing transistor having a gate coupled to the gate of the output transistor to generate a sense current based on the output current of the driver; and
    a second current source switchably coupled to the gate of the output transistor, wherein the second current source is configured to provide an additional pre-drive current to the output transistor based on the sense current when electrically coupled to the gate of the output transistor.

2. The driver of claim 1, further comprising:
    a switch coupled in series with the second current source.

3. The driver of claim 2, further comprising:
    a reference current source configured to generate a reference current, wherein the current sensor and the reference current source are coupled to a control input of the switch.

4. The driver of claim 2, wherein the switch is configured to trigger when the sense current exceeds a reference current.

5. The driver of claim 1, wherein the second current source is configured to provide an additional pre-drive current to the output transistor when the output current of the driver is above a threshold.

6. The driver of claim 5, wherein the second current source is electrically decoupled from the gate of the output transistor when the output current of the driver is below the threshold.

7. The driver of claim 1, wherein the first rail comprises a voltage supply rail, and the output transistor comprises a p-type field effect transistor having a source coupled to the voltage supply rail and a drain coupled to the output of the driver.

8. The driver of claim 1, wherein the first rail comprises a ground rail, and the output transistor comprises an n-type field effect transistor having a source coupled to the ground rail and a drain coupled to the output of the driver.

9. The driver of claim 1, wherein the gate of the sensing transistor is capacitively coupled to the output of the output transistor through a gate-to-drain capacitance of the output transistor.

10. The driver of claim 1, wherein a source of the sensing transistor is coupled to the first rail.

11. A slew-rate control method for a driver, the driver including an output transistor coupled between a rail and an output of the driver, the method comprising:
    pre-driving a gate of the output transistor with a pre-drive current using a first current source;
    generating a sense current based on the output current of the driver using a sense transistor having a gate coupled to a gate of the output transistor; and
    providing an additional pre-drive current, using a second current source, to the gate of the output transistor based on the sense current.

12. The method of claim 11, wherein the rail comprises a voltage supply rail, and the output transistor comprises a p-type field effect transistor having a source coupled to the voltage supply rail and a drain coupled to the output of the driver.

13. The method of claim 12, further comprising decreasing a voltage at the gate of the output transistor by the additional pre-drive current.

14. The method of claim 11, wherein the rail comprises a ground rail, and the output transistor comprises an n-type field effect transistor having a drain coupled to the output of the driver and a source coupled to the ground rail.

15. The method of claim 14, further comprising increasing a voltage at the gate of the output transistor by the additional pre-drive current.

16. The method of claim 11, wherein providing the additional pre-drive current using the second current source based on the sense current comprises electrically coupling the second current source to the gate of the output transistor when the sense current is above a reference current.

17. The method of claim 16, further comprising electrically decoupling the second current source from the gate of the output transistor when the sense current is below the reference current.

* * * * *